(12) United States Patent
Liu

(10) Patent No.: US 12,380,844 B2
(45) Date of Patent: *Aug. 5, 2025

(54) DISPLAY PANEL AND DISPLAY DEVICE

(71) Applicant: Shanghai Tianma Micro-Electronics Co., Ltd., Shanghai (CN)

(72) Inventor: Shaowei Liu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/673,260

(22) Filed: May 23, 2024

(65) Prior Publication Data

US 2024/0312403 A1    Sep. 19, 2024

Related U.S. Application Data

(63) Continuation of application No. 17/930,724, filed on Sep. 9, 2022, now Pat. No. 12,020,638.

(30) Foreign Application Priority Data

Jun. 7, 2022  (CN) .......................... 202210635169.9

(51) Int. Cl.
*G09G 3/32* (2016.01)
*G09G 3/3225* (2016.01)
(Continued)

(52) U.S. Cl.
CPC ....... *G09G 3/3225* (2013.01); *H10K 59/1213* (2023.02); *H10K 59/131* (2023.02); *G09G 2320/0686* (2013.01)

(58) Field of Classification Search
CPC ...... G09G 3/3275; G09G 3/3266; G09G 3/20; G09G 3/3225; G09G 2320/0686;
(Continued)

(56) References Cited

U.S. PATENT DOCUMENTS 11,361,713 B1    6/2022  Fu
2020/0152134 A1*  5/2020  Lee .......................... G09G 3/20
(Continued)

FOREIGN PATENT DOCUMENTS

CN    113053290 A    6/2021
CN    113053309 A    6/2021
(Continued)

*Primary Examiner* — Michael A Faragalla
(74) *Attorney, Agent, or Firm* — KILPATRICK TOWNSEND & STOCKTON LLP

(57) ABSTRACT

A display panel and a display device are provided. First pixel driving circuits are arranged in a display transition area, and the influence of the first pixel driving circuit on a display light transmissive area is avoided, and the light transmittance of the display light transmissive area is improved. A first pixel gap is arranged between adjacent first pixel driving circuits in a first display area, ensuring that a first signal line passes through the first display area from the first pixel gap, without the need to perform discontinuation processing on the first signal line at the first display area, and the problem of load difference between two discontinued wirings due to the discontinuation of the first signal line is avoided, to eliminate the position restriction of the first display area, and providing innovation for the development of the technology of under-screen devices.

19 Claims, 23 Drawing Sheets

(51) Int. Cl.
*H10K 59/121* (2023.01)
*H10K 59/131* (2023.01)

(58) Field of Classification Search
CPC ....... H01L 27/32; H01L 51/56; H10K 59/131; H10K 59/1213
See application file for complete search history.

(56) References Cited

U.S. PATENT DOCUMENTS

| | | |
|---|---|---|
| 2020/0286432 A1 | 9/2020 | Zhang et al. |
| 2021/0376008 A1* | 12/2021 | Tan ..................... G09G 3/3208 |
| 2021/0384289 A1 | 12/2021 | Li et al. |
| 2023/0263027 A1* | 8/2023 | Du ...................... H10K 59/131 257/40 |

FOREIGN PATENT DOCUMENTS

| | | |
|---|---|---|
| CN | 113314073 A | 8/2021 |
| CN | 113471264 A | 10/2021 |

* cited by examiner

DISPLAY PANEL AND DISPLAY DEVICE

CROSS-REFERENCE TO RELATED APPLICATIONS

This application is a continuation of U.S. patent application Ser. No. 17/930,724, titled "DISPLAY PANEL AND DISPLAY DEVICE", filed on Sep. 9, 2022, which claims benefit of priority from Chinese application NO. 202210635169.9, titled "DISPLAY PANEL AND DISPLAY DEVICE", filed Jun. 7, 2022, with the China National Intellectual Property Administration, which is incorporated herein by reference in its entirety.

FIELD

The present disclosure relates to the field of display technology, and in particular to a display panel and a display device.

BACKGROUND

Nowadays, with the rapid development of display technology, the emergence of various screen technologies provides infinite possibilities for electronic terminals. In particular, with the rapid application of display technology represented by Organic Light-Emitting Diodes (OLED), various mobile terminals with "full screen", "special-shaped screen", "under-screen voice" and "under-screen fingerprint" as their selling points have begun to be rapidly promoted. Major mobile phone and panel manufacturers have launched many products with "full screen" as the selling point. However, most of them still use "notch screen", "water-drop screen" and other similar full screen designs. This is because the mobile terminal has a front camera, and it is unavoidable to reserve an area for the front camera. That is, a display area accounts for a relatively low proportion of an existing display panel. In order to solve a problem of low proportion of the display area, technicians have developed a technology in which a display interface is completely covered by a display screen. That is, a photosensitive element is designed under the screen.

SUMMARY

In view of this, a display panel and a display device are provided according to the present disclosure, which are suitable for the technology of using under-screen devices.

A display panel is provided according to the present disclosure. The display panel includes a first display area and a second display area. The first display area includes a display light transmissive area and a display transition area located between the display light transmissive area and the second display area.

The first display area includes multiple first pixel driving circuits, and the multiple first pixel driving circuits are located in the display transition area. In a first direction, a first pixel gap is present between two adjacent first pixel driving circuits.

The display panel further includes multiple first signal lines extending in a second direction. Each of the first signal lines extends from the second display area through the display transition area. In the display transition area, the first signal line passes through the first pixel gap. The first direction and the second direction intersect with each other.

Accordingly, a display device including the above-mentioned display panel is further provided according to the present disclosure.

Compared with the conventional technology, the embodiments of the present disclosure have at least the following feature.

A display panel and a display device are provided according to the present disclosure. The display panel includes a first display area and a second display area. The first display area includes a display light transmissive area and a display transition area located between the display light transmissive area and the second display area. The first display area includes multiple first pixel driving circuits, and the multiple first pixel driving circuits are located in the display transition area. In a first direction, a first pixel gap is present between two adjacent first pixel driving circuits. The display panel further includes multiple first signal lines extending in a second direction. Each of the first signal lines extends from the second display area through the display transition area. In the display transition area, the first signal line passes through the first pixel gap. The first direction and the second direction intersect with each other.

As can be seen from the above description, in the embodiments of the present disclosure, each first pixel driving circuit is arranged in a display transition area, and the influence of the first pixel driving circuit on a display light transmissive area is avoided, and the light transmittance of the display light transmissive area is improved. Meanwhile, a first pixel gap is arranged between adjacent first pixel driving circuits located in a first display area, to ensure that a first signal line passes through the first display area via the first pixel gap, without the need to perform discontinuation processing on the first signal line in the first display area, and the problem of load difference between two discontinued wirings due to the discontinuation of the first signal line is avoided, to eliminate the position restriction of the first display area, and providing innovation for the development of the technology of under-screen devices.

BRIEF DESCRIPTION OF THE DRAWINGS

For more clearly illustrating embodiments of the present disclosure, the drawing referred to describe the embodiments will be briefly described hereinafter. Apparently, the drawing in the following description is only an example of the present disclosure.

DETAILED DESCRIPTION OF EMBODIMENTS

The embodiments of the present disclosure will be described clearly and completely as follows in conjunction with the drawings in the embodiments of the present disclosure. It is apparent that the described embodiments are only a part of the embodiments according to the present disclosure, rather than all of the embodiments.

As mentioned in the background, in order to solve a problem of low proportion of the display area, technicians have developed a technology in which a display interface is completely covered by a display screen. That is, a photosensitive element is designed under the screen. However, in the existing display panel designed with an under-screen photosensitive element, a position of an area where the photosensitive element is arranged is fixed, which limits the development of the technology of under-screen photosensitive elements.

Based on this, a display panel and a display device are provided according to the embodiments of the present disclosure, effectively solving the problems existing in the conventional technology, eliminating the position restriction of the first display area, and providing innovation for the development of the technology of under-screen devices.

The embodiments of the present disclosure, which are described in detail in conjunction with FIGS. 1 to 35.

Figure 1:
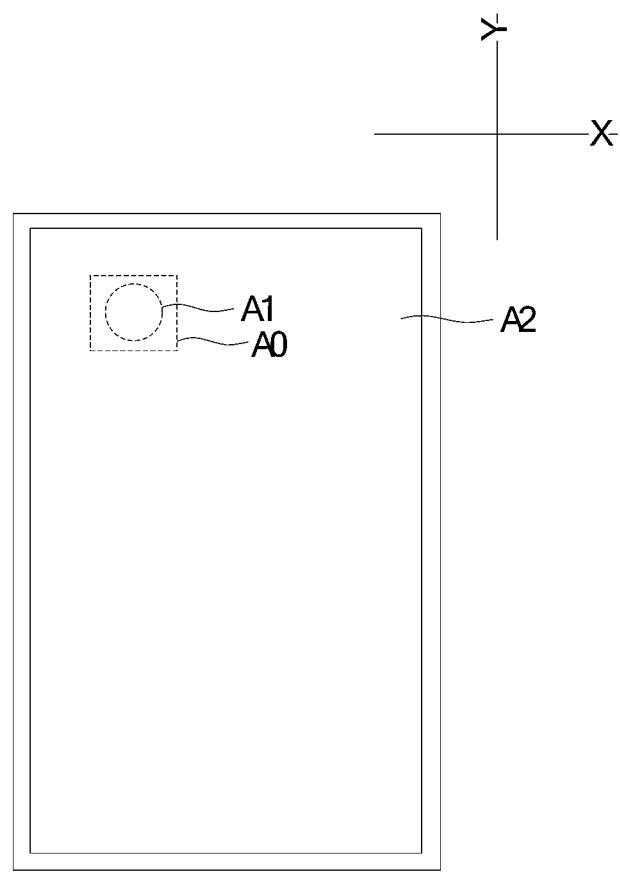
FIG. 1 is a schematic structural diagram of a display panel according to an embodiment of the present disclosure.
Figure 2:
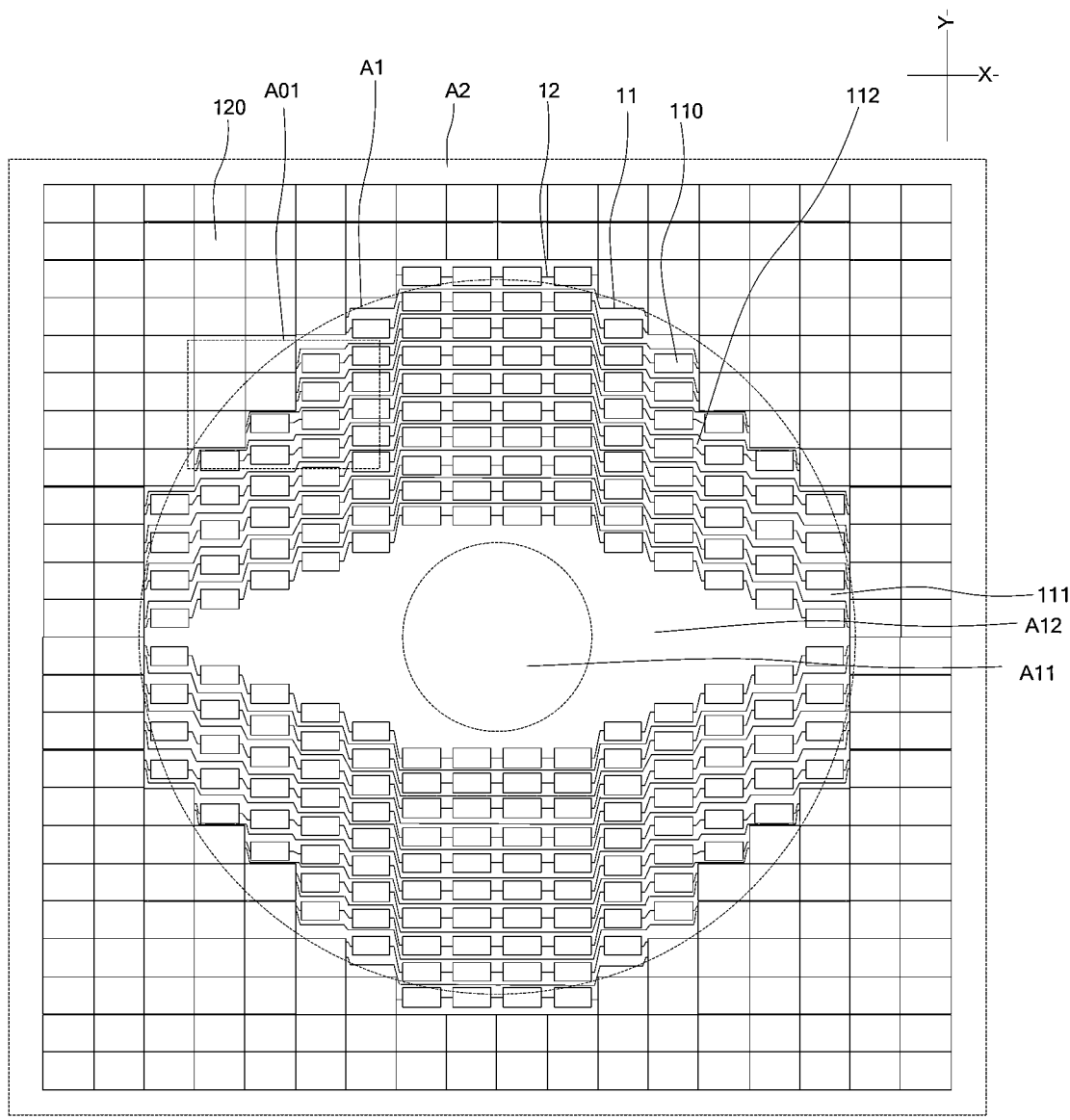
FIG. 2 is an enlarged schematic diagram of an area A0 in FIG. 1.

FIG. 1 is a schematic structural diagram of a display panel according to an embodiment of the present disclosure. FIG. 2 is an enlarged schematic diagram of an area A0 in FIG. 1. In FIG. 1, the area A0 includes a first display area A1 and a portion of a second display area A2 surrounding the first display area A1.

Referring to FIGS. 1 and 2, a display area of the display panel includes a first display area A1 and a second display area A2. The first display area A1 includes a display light transmissive area A11 and a display transition area A12 located between the display light transmissive area A11 and the second display area A2.

The first display area A1 includes multiple first pixel driving circuits 110, and the multiple first pixel driving circuits 110 are located in the display transition area A12. In a first direction Y, a first pixel gap 111 is present between two adjacent first pixel driving circuits 110.

The display panel further includes multiple first signal lines 11 extending in a second direction X. Each of the first signal lines 11 extends from the second display area A2 through the display transition area A12. In the display transition area A12, the first signal line 11 passes through the first pixel gap 111. The first direction Y and the second direction X intersect with each other.

It should be noted that the first direction and the second direction in the embodiment of the present disclosure intersect with each other. In an embodiment, the first direction and the second direction are perpendicular to each other. The display panel includes multiple data lines. The first direction Y may be an extension direction of the data lines, and the second direction X may be an arrangement direction of the multiple data lines.

Figure 3:
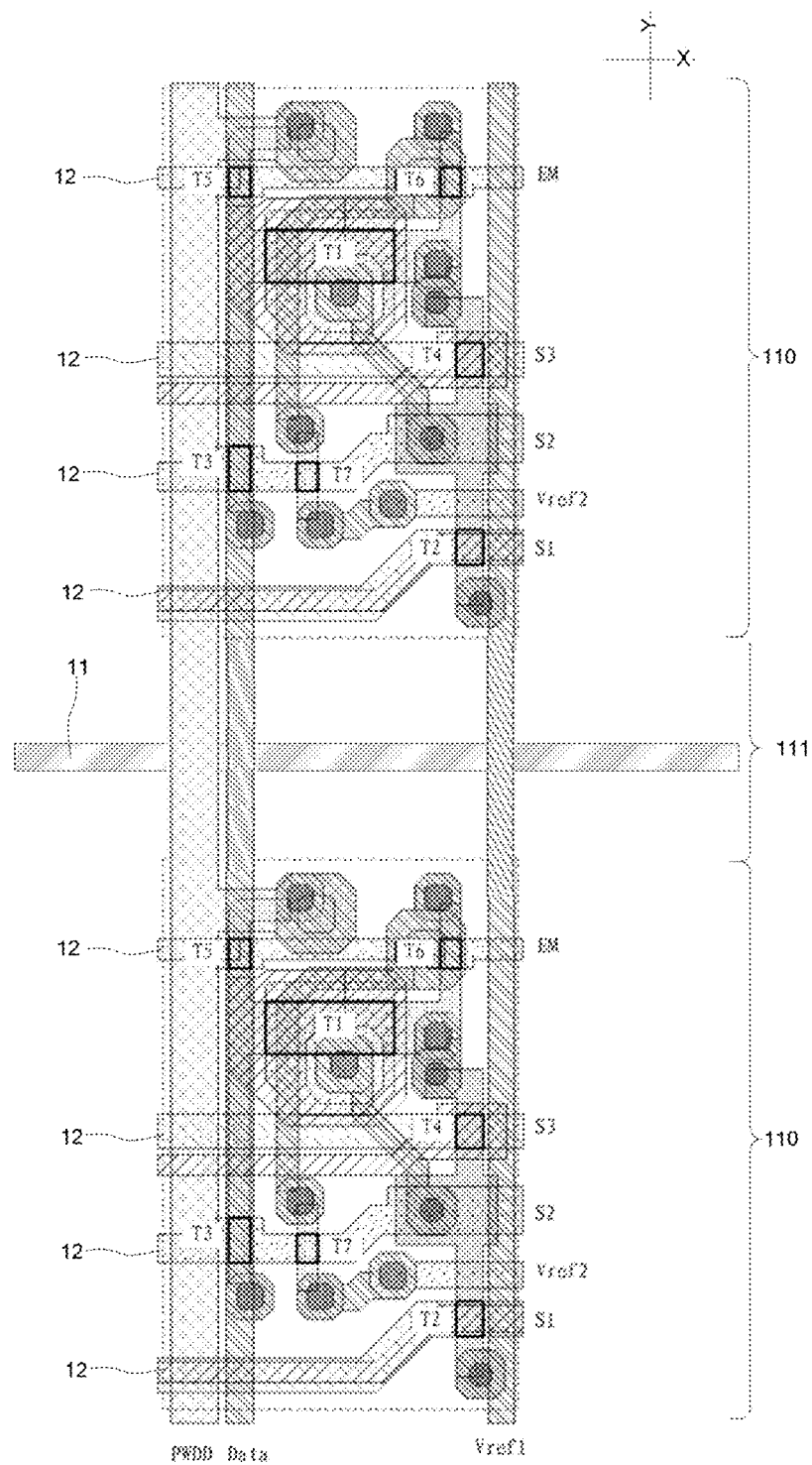
FIG. 3 is a schematic structural diagram of two adjacent first pixel driving circuits according to an embodiment of the present disclosure.

FIG. 3 is a schematic structural diagram of two adjacent first pixel driving circuits according to an embodiment of the present disclosure. The pixel driving circuit 110 shown in FIG. 3 is a circuit layout, and reference may be made to a circuit shown in FIG. 23 for an equivalent circuit diagram of the pixel driving circuit 110. The arrangement order of the film layers corresponding to the wirings is only illustrative, and may be set as needed. In a first direction Y, a first pixel gap 111 is present between two adjacent first pixel driving circuits 110, and a first signal line 11 passes through the first pixel gap 111.

As can be seen from the above description, in the embodiments of the present disclosure, a first pixel driving circuit is arranged in a display transition area, and the influence of the first pixel driving circuit on a display light transmissive area is avoided, and the light transmittance of the display light transmissive area is improved. Meanwhile, a first pixel gap is arranged between adjacent first pixel driving circuits located in a first display area, to ensure that a first signal line passes through the first display area from the first pixel gap, without the need to perform discontinuation processing on the first signal line in the first display area, and the problem of load difference between two discontinued wirings due to the discontinuation of the first signal line is avoided, to eliminate the position restriction of the first display area, and providing innovation for the development of the technology of under-screen devices.

It should be noted that, in the relevant drawings, the position of the film layer layout of the first pixel driving circuit 110 and the position of the film layer layout of the second pixel driving circuit 120 are illustrated by blocks respectively.

Referring to FIG. 2, the display panel further includes multiple second pixel driving circuits 120. The second pixel driving circuits 120 are located in the second display area A2. The display panel further includes multiple second signal lines 12. Each of the second signal lines 12 extends from the second display area A2 through the display transition area A12. In the display transition area A12, the second signal line 12 is electrically connected to the first pixel driving circuit 110 (as shown in FIG. 3). In the second display area A2, the second signal line 12 is electrically connected to the second pixel driving circuit 120. That is, according to the embodiment of the present disclosure, the second display area A2 includes multiple second pixel driving circuits 120, and the display panel further includes multiple second signal lines 12 extending in the second direction X. The first signal line 11 is electrically connected to the second pixel driving circuit 120, and each of the second signal lines 12 is electrically connected to the first pixel driving circuit 110 and the second pixel driving circuit 120.

In the second display area A2, the first signal line 11 and the second signal line 12 may be connected to different rows of pixel driving sub-circuits of the second pixel driving circuit 120. For example, the second pixel driving circuit 120 includes pixel driving sub-circuits in two rows and four columns. The first signal line 11 is electrically connected to the pixel driving sub-circuits in one row, and the second signal line 12 is electrically connected to the pixel driving sub-circuits in the other row.

As shown in FIG. 2, the first signal line 11 in the embodiment of the present disclosure is not electrically connected to the first pixel driving circuit 110. In an embodiment, the first signal line 11 may be electrically connected to the second pixel driving circuit 120 in the second display area A2, and when extending to the first display area A1 in the second direction X, the first signal line 11 passes through the first pixel gap 111 between adjacent first pixel driving circuits 110. Therefore, it is unnecessary to perform discontinuation processing on the first signal line 11 at an edge of the first display area A1, which avoids load difference between two wiring segments when the first signal line 11 is discontinued. Therefore, a position of the first display area A1 on the display panel can be flexibly set. For example, the first display area A1 may be set at a top position, a middle position, a side position or the like of the display panel, which is not limited in the present disclosure.

FIG. 1 illustrates that, in the second direction X, the first display area A1 is located at a left-of-center position of the display area. In other embodiments, in the second direction X, the first display area A1 may be located at a midpoint position or a right-of-center position of the display area, or at a position in contact with a left edge or a right edge of the display area, and so on.

Figure 4:
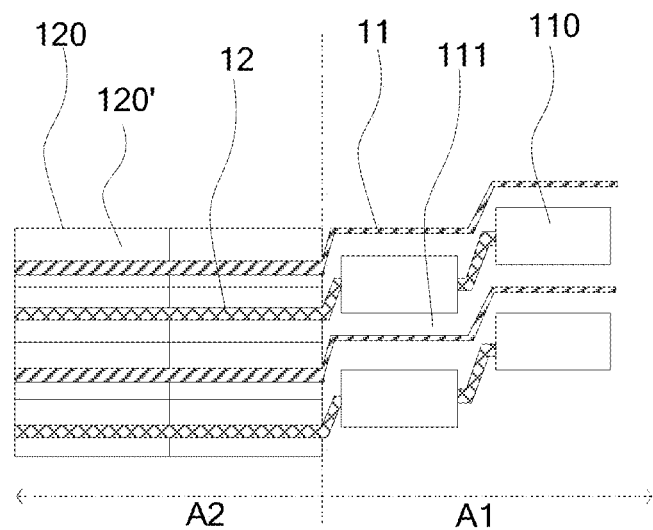
FIG. 4 is a partial schematic structural diagram of a display panel according to an embodiment of the present disclosure.

FIG. 4 is a partial schematic structural diagram of a display panel according to an embodiment of the present disclosure. In FIG. 4, the signal line and the pixel driving circuit are shown as connected, indicating that the signal line includes a part of the film layer layout of the pixel driving circuit. According to the present disclosure, a line width of the first signal line 11 in the first display area A1 may be smaller than a line width of the first signal line 11 in the second display area A2. According to an embodiment of the present disclosure, a line width of at least a part of the first signal line 11 is smaller than a line width of the second signal line 12. In one embodiment, according to an embodiment of the present disclosure, the second signal line 12 has a uniform line width. That is, a line width of the second signal line 12 in the first display area A1 is the same as a line width of the second signal line 12 in the second display area A2. A line width of the first signal line 11 in the second display area A2 may be set to be the same as the line width of the second signal line 12, where a line width of the first signal line 11 in the first display area A1 is smaller than the line width of the second signal line 12. Thus, loads of the first signal line 11 and the second signal line 12 can be designed to be consistent, to ensure that signal transmission performance by the first signal line 11 and the second signal line 12 are basically the same. In addition, the line width of the first signal line 11 in the first display area A1 being smaller than the line width of the first signal line 11 in the second display area A2 can prevent the first signal line 11 from occupying too much of the first display area A1 with a limited area, and thus optimize a circuit design of the first display area A1.

A line width of the first signal line 11 in the first display area A1 may be the same as a line width of the first signal line 11 in the second display area A2, and a line width of the second signal line 12 in the first display area A1 may be the same as a line width of the second signal line 12 in the second display area A2, thus simplifying the circuit design.

The first pixel driving circuit 110 includes at least one pixel driving sub-circuit 110', and the second pixel driving circuit 120 includes at least one pixel driving sub-circuit 120'. The pixel driving sub-circuits 110' and 120' are circuit units having a pixel driving function.

An equivalent arrangement density of the pixel driving sub-circuits 110' in the first display area A1 may be less than or equal to an arrangement density of the pixel driving sub-circuits 120' in the second display area A2. Where the equivalent arrangement density of the pixel driving sub-circuits 110' in the first display area A1 is smaller than that of the pixel driving sub-circuits 120' in the second display area A2, in the first display area A1, pixel driving sub-circuits 110' for driving light emitting elements located in the display light transmissive area A11 and pixel driving sub-circuits 110' for driving light emitting elements located in the display transition area A12 may be both arranged in the display transition area A12. The influence of the pixel driving sub-circuits 110' on the light transmittance of the display light transmissive area A11 is eliminated, and the light transmittance of the display light transmissive area A11 is improved. The equivalent arrangement density can be understood as a ratio of the number of pixel driving sub-circuits in the first display area to an area of the first display area.

In the first display area A1 and the second display area A2, the pixel driving sub-circuits 110' and 120' may be arranged in multiple rows. In the first display area A1 and an area extending from the first display area A1 in the second direction X, in the multiple rows of the pixel driving sub-circuits, one row (the row consisting of pixel driving sub-circuits 120' of the second pixel driving circuit 120) is arranged between any two adjacent pixel driving sub-circuit rows each including pixel driving sub-circuits 110' of the first pixel driving circuit 110; multiple rows (the multiple rows consist of pixel driving sub-circuits 120' of the second pixel driving circuit 120) are arranged between any two adjacent pixel driving sub-circuit rows each including pixel driving sub-circuits 110' of the first pixel driving circuit 110; at least one row (the at least one row consists of pixel driving sub-circuits 120' of the second pixel driving circuit 120) is provided between any two adjacent groups each of multiple pixel driving sub-circuit rows including pixel driving sub-circuits 110' of the first pixel driving circuits 110, which is not limited in the present disclosure.

Figure 5:
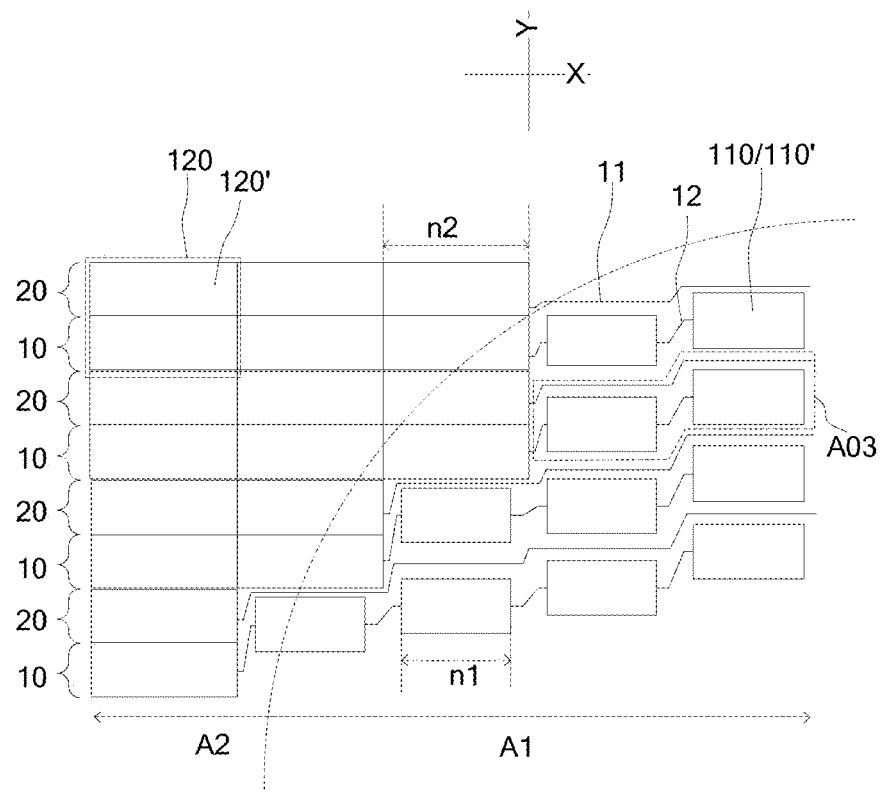
FIG. 5 is a partial schematic structural diagram of a display panel according to an embodiment of the present disclosure.

In one embodiment, FIG. 5 is a partial schematic structural diagram of a display panel according to an embodiment of the present disclosure. FIG. 5 shows a structure in an area A01 in FIG. 2. In FIG. 5, the description is given by taking as an example that a pixel driving sub-circuit row including a pixel driving sub-circuit 110' of the first pixel driving circuit 110 is arranged in every other row. In the first display area A1 and the area extending from the first display area A1 in the second direction X, there are multiple rows of pixel driving sub-circuits arranged in the first direction Y. The multiple rows of the pixel driving sub-circuits include multiple first-type pixel driving sub-circuit rows 10 and multiple second-type pixel driving sub-circuit rows 20, and each of the second-type pixel driving sub-circuit rows 20 is located between two adjacent first-type pixel driving sub-circuit rows 10. Each of the first-type pixel driving sub-circuit row 10 includes a pixel driving sub-circuit 110' of the first pixel driving circuit 110 and a pixel driving sub-circuit 120' of the second pixel driving circuit 120. The second-type pixel driving sub-circuit row 20 is formed by pixel driving sub-circuits 120' of the second pixel driving circuit 120. The first-type pixel driving sub-circuit row 10 is electrically connected to the second signal line 12, and the second-type pixel driving sub-circuit row 20 is electrically connected to the first signal line 11. In the first display area A1, the first signal line 11 is located in a gap between adjacent first-type pixel driving sub-circuit rows 10.

In FIG. 5, the first pixel driving circuit 110 includes one pixel driving sub-circuit 110', and the second pixel driving circuit 120 includes two pixel driving sub-circuits 120' arranged in two rows and one column, for example.

As shown in FIG. 5, according to the present disclosure, in the first direction Y, a column of the first pixel driving circuits 110 is arranged corresponding to a column of the second pixel driving circuits 120. That is, the column of the first pixel driving circuits 110 and the column of the second pixel driving circuits 120 are located in the same column. According to the embodiment of the present disclosure, a length of the first pixel driving circuit 110 in a direction (the second direction X as shown in FIG. 5) perpendicular to the first direction Y is n1, and a length of the second pixel driving circuit 120 in the direction perpendicular to the first direction Y is n2, where n1<n2. Since it is required to set up space for an inclined line segment in both the first direction Y and the second direction X, by configuring the length of the first pixel driving circuit and the length of the second pixel driving circuit in the second direction X in accordance with the above-mentioned relationship, space for accommodating an inclined line segment and a part of a straight line segment of the first signal line 11 and an inclined line segment and a part of a straight line segment of the second signal line 12 is provided. In addition, a second pixel gap may also be provided between first pixel driving circuits 110 in adjacent columns. A signal line (e.g., a reset signal line, a data signal line or a power line) extending in the first direction Y may be located in the second pixel gap.

Figure 6:
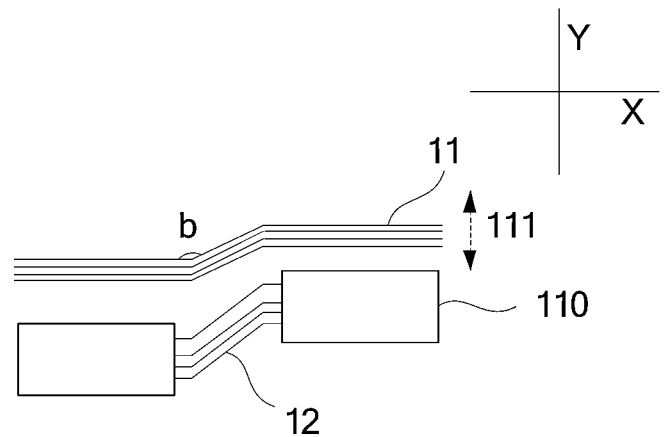
FIG. 6 is an enlarged schematic diagram of an area A03 in FIG. 5.

FIG. 6 is an enlarged schematic diagram of an area A03 in FIG. 5. As shown in FIG. 6, the first pixel driving circuits 110 located in the same row may each be connected to multiple second signal lines 12. In FIG. 6, four second signal lines 12 are shown for example. The number of the first signal lines 11 passing through the first pixel gap 111 between the first pixel driving circuits 110 in two adjacent rows may also be more than one. In FIG. 6, four first signal lines pass through the same first pixel gap 111 for example. An included angle between an inclined line segment of the first signal line and the second direction X is b. In a case that an interval between straight line segments of adjacent first signal lines 11 is fixed, if the included angle b is large (that is, a slope of the inclined line segment is gentle), an interval between inclined line segments of adjacent first signal lines 11 is large, which can prevent a short circuit between adjacent first signal lines 11. Conversely, if the included angle b is small (that is, the slope of the inclined line segment is steep), an interval between inclined line segments of adjacent first signal lines 11 is small, which is likely to cause a short circuit between adjacent first signal lines 11. Similarly, a layout design of the first pixel driving circuit 110 affects a position of the second signal line 12 drawn therefrom. In a case that an interval between adjacent second signal lines 12 is fixed, if an included angle between an inclined line segment of the second signal line 12 and the second direction X is large (that is, a slope of the inclined line segment is gentle), an interval between inclined line segments of adjacent second signal lines 12 is large, which can prevent a short circuit between adjacent second signal lines 12.

Figure 7:
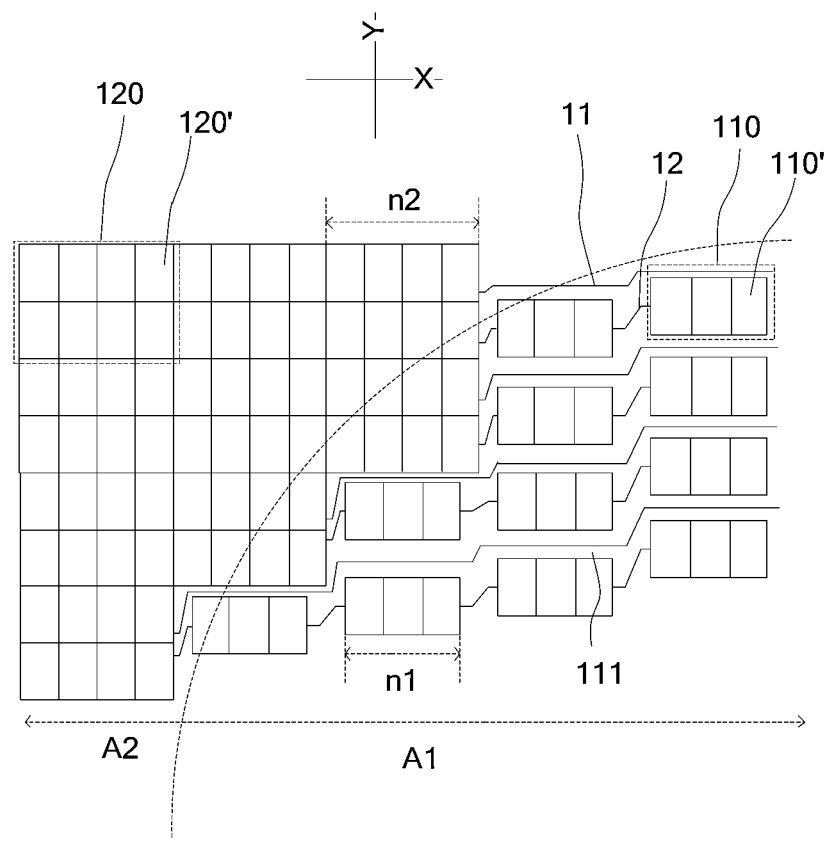
FIG. 7 is a partial schematic structural diagram of a display panel according to an embodiment of the present disclosure.

The first pixel driving circuit 110 may include multiple pixel driving sub-circuits 110', and the second pixel driving circuit 120 may include multiple pixel driving sub-circuits 120'. In one embodiment, FIG. 7 is a partial schematic structural diagram of a display panel according to an embodiment of the present disclosure. FIG. 7 shows a structure in the area A01 in FIG. 2. The first pixel driving circuit 110 includes three pixel driving sub-circuits 110' in one row and three columns (an extension of one row of pixel driving sub-circuits 110' is an extension in the second direction X), and the second pixel driving circuit 120 includes eight pixel driving sub-circuits 120' in two rows and four columns (an extension of any row of pixel driving sub-circuits 120' is an extension in the second direction X). The multiple second pixel driving circuits 120 are arranged in an array. The first signal line 11 is electrically connected to one row of pixel driving sub-circuits 120' of the second pixel driving circuit 120 in the second display area A2, and passes through the first pixel gap 111 in the first display area A1. The second signal line 12 is electrically connected to the other row of pixel driving sub-circuits 120' of the second pixel driving circuit 120 in the second display area A2, and is electrically connected to the pixel driving sub-circuits 110' of the first pixel driving circuit 110 in the first display area A1.

As shown in FIG. 7, in a case that the first pixel driving circuit 110 includes three columns of pixel driving sub-circuits 110', and the second pixel driving circuit 120 includes four columns of pixel driving sub-circuits 120', a length of the three columns of pixel driving sub-circuits 110' in a direction (the second direction X as shown in FIG. 7) perpendicular to the first direction Y is n1, and a length of the four columns of pixel driving sub-circuits 120' in the direction perpendicular to the first direction Y is n2, where n1<n2.

The dimension n1 of the first pixel driving circuit 110 in the second direction may also satisfy a relationship: $n1 \geq 1/5 \times n2$, and further, $n1 \geq 1/3 \times n2$.

Figure 8:
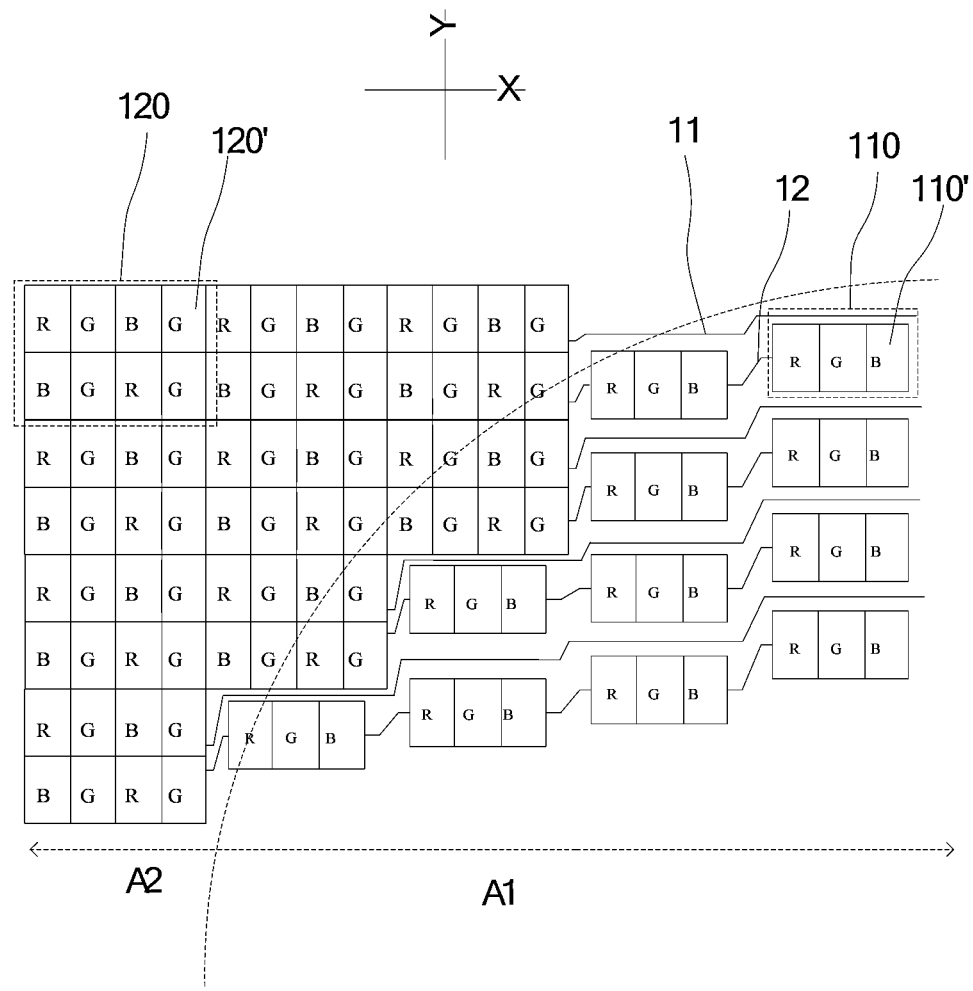
FIG. 8 is a partial schematic structural diagram of a display panel according to an embodiment of the present disclosure.
Figure 9:
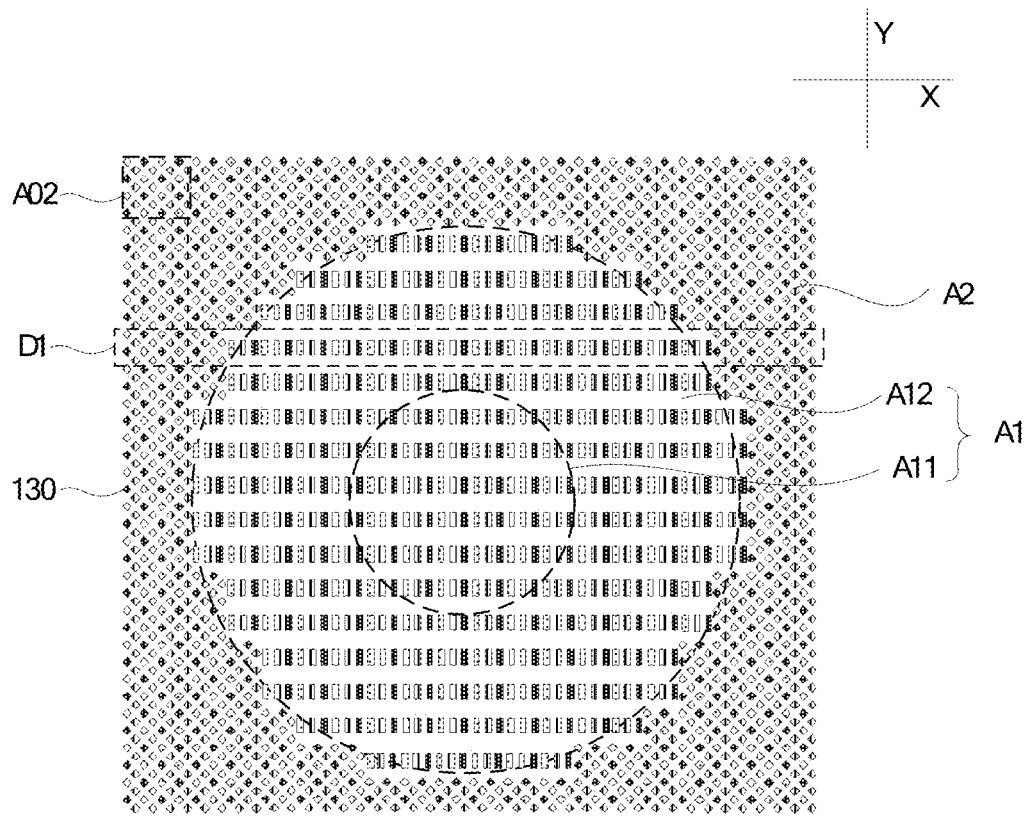
FIG. 9 is another enlarged schematic diagram of the area A0 in FIG. 1.
Figure 10:
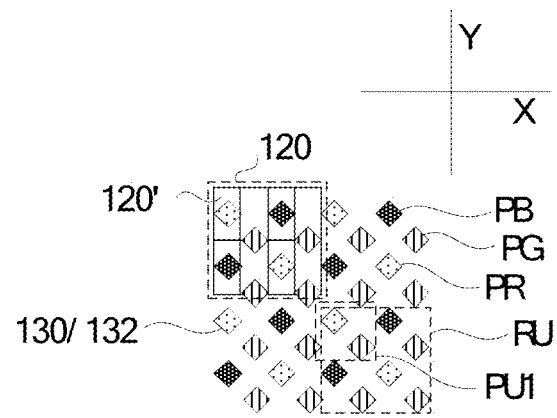
FIG. 10 is an enlarged schematic diagram of an area A02 in FIG. 9.
Figure 11:
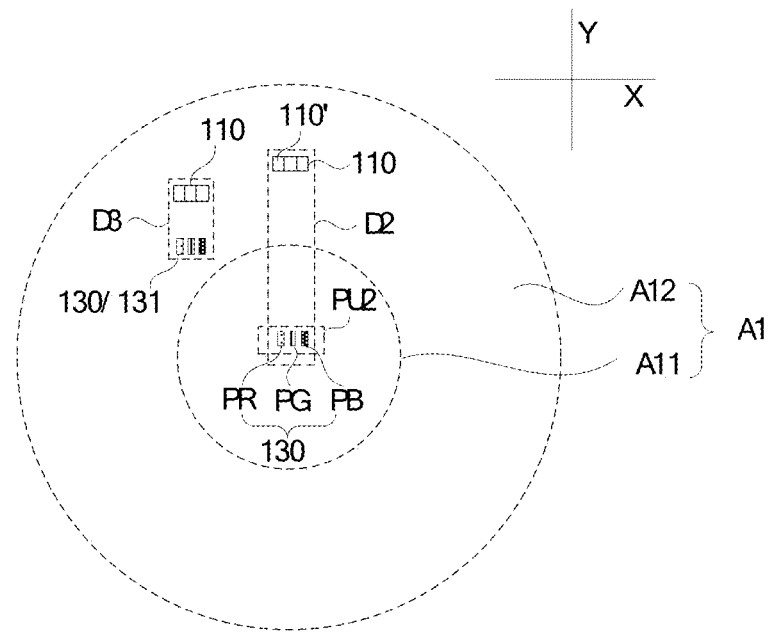
FIG. 11 is a schematic diagram of a first display area in FIG. 9.

FIG. 8 is a partial schematic structural diagram of a display panel according to an embodiment of the present disclosure. FIG. 8 shows a structure in the area A01 in FIG. 2. FIG. 9 is another enlarged schematic diagram of the area A0 in FIG. 1. FIG. 10 is an enlarged schematic diagram of an area A02 in FIG. 9. FIG. 11 is a schematic diagram of a first display area in FIG. 9. FIG. 8 illustrates pixel driving circuits and wirings. FIG. 9 is a schematic diagram of an arrangement of light emitting elements in a first display area and a second display area. FIG. 10 also illustrates a positional relationship between a second pixel driving circuit and a light emitting element. FIG. 11 illustrates a driving relationship between a first pixel driving circuit and a light emitting element.

As shown in FIGS. 8 to 11, a pixel driving circuit in the embodiment of the present disclosure is configured to drive a light emitting element, and the light emitting element at a corresponding position emits light of a corresponding color. In the figures, light emitting elements having the same filling pattern represent light emitting elements having the same color.

As shown in FIG. 8, the pixel driving sub-circuits 110' and 120' include a pixel driving sub-circuit R that drives a red light emitting element PR, a pixel driving sub-circuit G that drives a green light emitting element PG, and a pixel driving sub-circuit B that drives a blue light emitting element PB.

In the first display area A1, the light emitting elements 130 may be uniformly arranged, and in the second display area A2, the light emitting elements 130 may also be uniformly arranged. In one embodiment, in the first display area A1, an arrangement density of the light emitting elements 130 may be gradually decreased in a direction from the display transition area A12 to the display light transmissive area A11, and the problem that there is a boundary between the first display area A1 and the second display area A2 in the display screen is mitigated, and the light transmittance of the display light transmissive area A11 can be further improved. In one embodiment, regarding the arrangement density of the light emitting elements 130, a transition area is provided at an edge position of the second display area A2 close to the first display area A1, and an arrangement density of the light emitting elements 130 in the transition area is between an arrangement density of the light emitting elements in other positions of the second display area A2 and an arrangement density of the light emitting elements in the first display area A1. Similarly, a transition area may be provided at an edge position of the first display area A1 close to the second display area A2. Thus, the problem that there is a boundary between the first display area A1 and the second display area A2 in the display screen is mitigated.

The light emitting elements 130 includes a red light emitting element PR, a green light emitting element PG, and a blue light emitting element PB.

As shown in FIGS. 9 and 10, in the second display area A2, regarding the arrangement of the light emitting elements 130, eight light emitting elements 130 may constitute one repeating unit RU, and multiple repeating units are repeatedly arranged in a row direction (direction X) and a column direction (direction Y). In one embodiment, the repeating unit RU includes two red light emitting elements PR, two blue light emitting elements PB and four green light emitting elements PG. The repeating unit RU includes four first pixel units PU1, where each of the first pixel units PU1 includes two light emitting elements 130 with different light emitting colors. Accordingly, the second pixel driving circuit 120 in an embodiment of the present disclosure may drive the light emitting element 130 by sub-pixel rendering (SPR) display method. In one embodiment, FIG. 10 illustrates that the second pixel driving circuit 120 includes eight pixel driving sub-circuits 120' arranged in two rows and four columns. The second pixel driving circuit 120 is configured to drive eight light emitting elements 130 of one repeating unit RU to emit light, where each of the pixel driving sub-circuits 120' is configured to drive one light emitting element 130 to emit light.

As shown in FIGS. 9 and 11, in the first display area A1, the first pixel driving circuit 110 is located in the display transition area A12, and the light emitting elements 130 includes both light emitting elements 130 located in the display transition area A12 and light emitting elements 130 located in the display light transmissive area A11. As shown in dashed box D2, the first pixel driving circuit 110 may be electrically connected to light emitting elements 130 located in the display light transmissive area A11, and drive the light emitting elements 130 to emit light. As shown in dashed box D3, the first pixel driving circuit 110 may be electrically connected to light emitting elements 130 located in the display transition area A12, and drive the light emitting elements 130 to emit light. It should be noted that, in order to clearly illustrate a driving relationship between the first pixel driving circuit and the light emitting element, only some of the first pixel driving circuits and some of the light emitting elements are shown in FIG. 11. The arrangement order of the light emitting elements PR, PG and PB is an example, which may be adjusted as needed.

Continuing with FIGS. 9 and 11, the first display area A1 includes multiple second pixel units PU2, and each of the second pixel units PU2 includes a red light emitting element PR, a green light emitting element PG and a blue light emitting element PB. The first pixel driving circuit 110 may drive the light emitting element by physical pixel (Real RGB) display method. In one embodiment, the first pixel driving circuit 110 may include three pixel driving sub-circuits 110', each first pixel driving circuit 110 drives one second pixel unit PU2, and each of the pixel driving sub-circuits 110' drives one light emitting element.

Exemplarily, the position of the light emitting element located in the first display area A1 and the position of the light emitting element located in the second display area A2 may have the following correspondence: a row where a repeating unit RU in the second display area A2 is located is arranged corresponding to a row where a light emitting element in the first display area A1 is located, as shown in dashed box D1 in FIG. 9.

Figure 12:
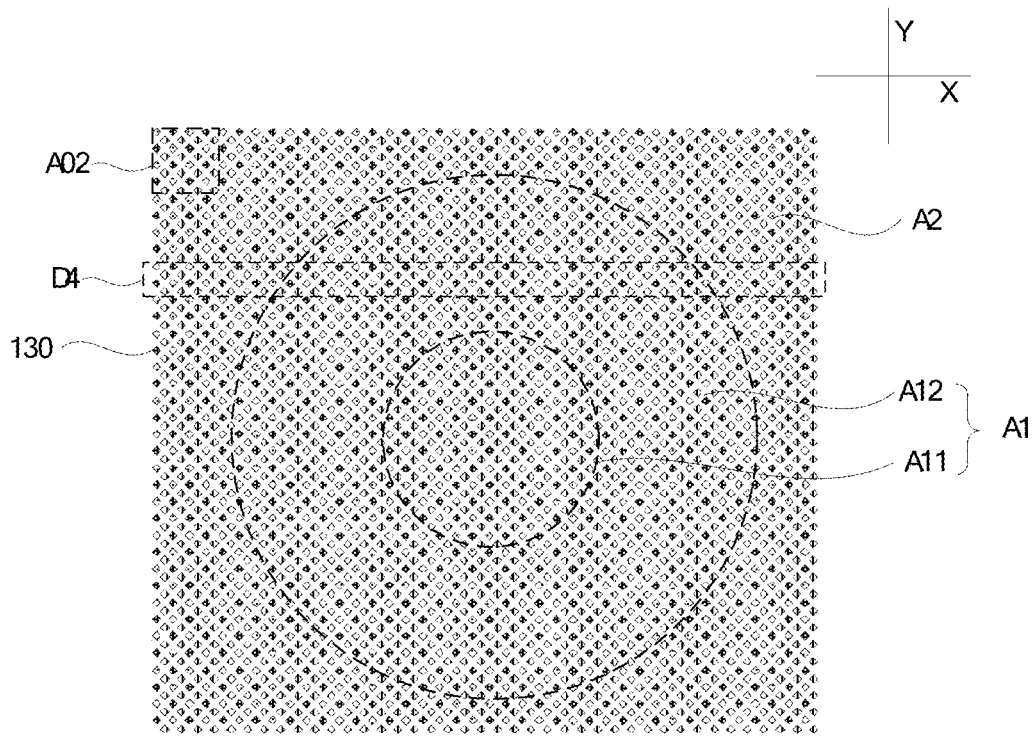
FIG. 12 is another enlarged schematic diagram of the area A0 in FIG. 1.
Figure 13:
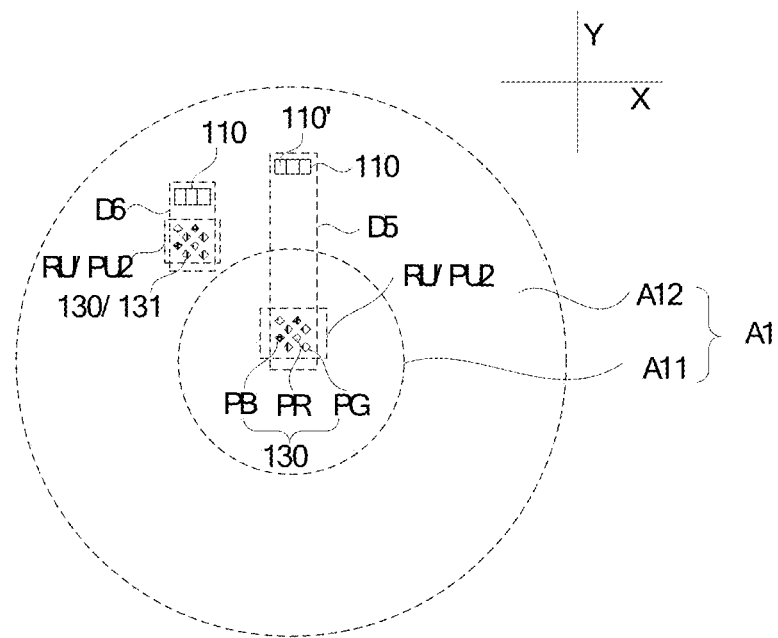
FIG. 13 is a schematic diagram of a first display area in FIG. 12.
Figure 14:
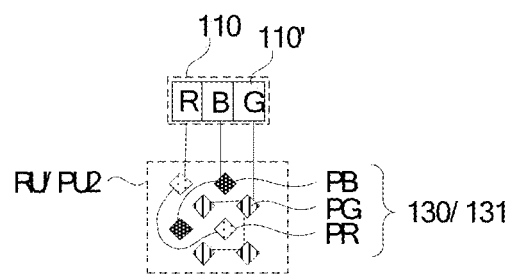
FIG. 14 is a schematic diagram of a dashed box D5 or D6 in FIG. 13.

FIG. 12 is another enlarged schematic diagram of the area A0 in FIG. 1. FIG. 13 is a schematic diagram of a first display area in FIG. 12. FIG. 14 is a schematic diagram of dashed box D5 or D6 in FIG. 13. For an enlarged schematic diagram of an area A02 in FIG. 12, reference may be made to FIG. 10 and relevant paragraphs. FIG. 12 is a schematic diagram of an arrangement of light emitting elements in a first display area and a second display area. FIG. 13 illustrates a driving relationship between a first pixel driving circuit and a light emitting element. FIG. 14 illustrates a driving relationship between a pixel driving circuit and a light emitting element.

In conjunction with FIGS. 8, 10 and 12 to 14, a pixel driving circuit is configured to drive a light emitting element to emit light. In the figures, light emitting elements having the same filling pattern represent light emitting elements having the same color.

As shown in FIG. 12, the light emitting elements 130 are uniformly arranged in the first display area A1 and the second display area A2. An arrangement density of light emitting elements 130 in the first display area A1 may be the same as an arrangement density of light emitting elements 130 in the second display area A2. An arrangement pattern of the light emitting elements 130 in the first display area A1 may be the same as an arrangement pattern of the light emitting elements 130 in the second display area A2. Thus, a display effect difference between the first display area A1 and the second display area A2 is reduced or eliminated. In one embodiment, an area of the light emitting element 130 located in the first display area A1 may be smaller than that of the light emitting element 130 located in the second display area A2, to improve the light transmittance of the first display area A1.

As shown in FIGS. 10 and 13, in the first display area A1 and the second display area A2, regarding the arrangement of the light emitting elements 130, eight light emitting elements 130 may constitute one repeating unit RU, and multiple repeating units are repeatedly arranged in a row direction (direction X) and a column direction (direction Y). One repeating unit RU includes two red light emitting elements PR, two blue light emitting elements PB and four green light emitting elements PG.

As shown in FIGS. 12 and 13, the first pixel driving circuit 110 is located in the display transition area A12, and the light emitting elements 130 includes both light emitting elements 130 located in the display transition area A12 and light emitting elements 130 located in the display light transmissive area A11. As shown in dashed box D5, the first pixel driving circuit 110 may be electrically connected to light emitting elements 130 located in the display light transmissive area A11, and drive the light emitting elements 130 to emit light. As shown in dashed box D6, the first pixel driving circuit 110 may be electrically connected to light emitting elements 130 located in the display transition area A12, and drive the light emitting elements 130 to emit light. It should be noted that, in order to clearly illustrate a driving relationship between the first pixel driving circuit and the light emitting element, only some of the first pixel driving circuits and some of the light emitting elements are shown in FIG. 13.

In conjunction with FIGS. 12 to 14, in the first display area A1, one repeating unit RU constitutes one second pixel unit PU2. In the second pixel unit PU2, two red light emitting elements PR are electrically connected to each other, two blue light emitting elements PB are electrically connected to each other, and four green light emitting elements PG are electrically connected to each other. A driving relationship between the pixel driving circuit and the light emitting element may be: the first pixel driving circuit 110 may include three pixel driving sub-circuits 110', and each first pixel driving circuit 110 drives one second pixel unit PU2. In one embodiment, one pixel driving sub-circuit R drives two red light emitting elements PR that are electrically connected to each other, one pixel driving sub-circuit B drives two blue light emitting elements PB that are electrically connected to each other, and one pixel driving sub-circuit G drives four green light emitting elements PG that are electrically connected to each other.

The position of the light emitting element located in the first display area A1 and the position of the light emitting element located in the second display area A2 may have the following correspondence: a row where a repeating unit RU in the second display area A2 is located is arranged corresponding to a row where a repeating unit RU in the first display area A1 is located, as shown in dashed box D4 in FIG. 12. It should be noted that, in FIGS. 10, 11 and 13, the light emitting element and the pixel driving circuit are shown in the same drawing, and for a film layer where the light emitting element is located and a film layer where the pixel driving circuit is located, reference may be made to FIG. 15.

In addition, it should be noted that a display method for the first display area A1 and the second display area A2 is not limited in the embodiment of the present disclosure, which may be designed according to practical applications.

In an embodiment of the present disclosure, any one of the first signal line 11 and the second signal line 12 in the present disclosure may include a light emitting control signal line and/or a scanning control signal line. The light emitting control signal line is a relevant line for providing a light emitting control signal for the pixel driving circuit, and the scanning control signal line is a relevant line for providing a scanning control signal for the pixel driving circuit.

Figure 15:
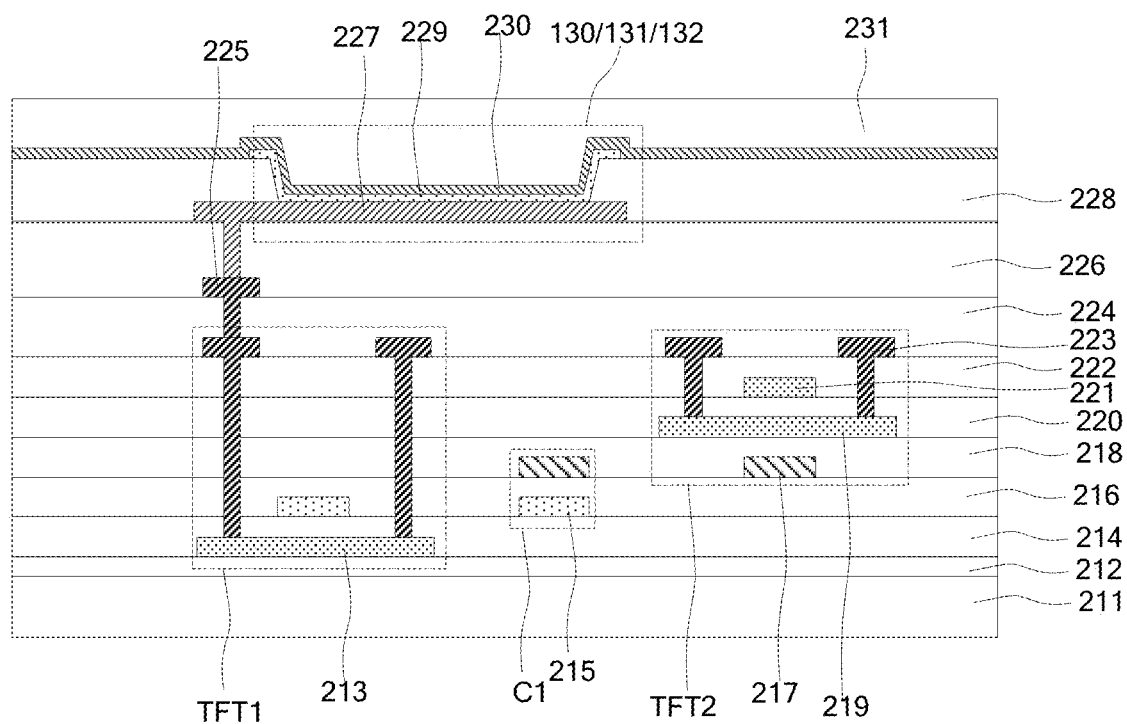
FIG. 15 is a schematic structural diagram of a display panel according to an embodiment of the present disclosure.

In an embodiment, different types of signal lines included in the first signal line 11 provided in the present disclosure may be arranged in different layers. For example, in a case that the first signal line 11 includes a light emitting control signal line and a scanning control signal line, the light emitting control signal line and the scanning control signal line may be located in different metal layers. FIG. 15 is a schematic structural diagram of a display panel according to an embodiment of the present disclosure. It should be noted that FIG. 15 only shows one panel structure among all structures applicable to the present disclosure. The display panel includes: a substrate 211; a buffer layer 212 located on the substrate 211; a polysilicon semiconductor layer 213 located on a side of the buffer layer 212 away from the substrate 211; a first gate insulating layer 214 located on a side of the polysilicon semiconductor layer 213 away from the substrate 211; a first metal layer 215 located on a side of the first gate insulating layer 214 away from the substrate 211; a capacitor insulating layer 216 located on a side of the first metal layer 215 away from the substrate 211; a capacitor metal layer 217 located on a side of the capacitor insulating layer 216 away from the substrate 211; a first interlayer insulating layer 218 located on a side of the capacitor metal layer 217 away from the substrate 211; an oxide semiconductor layer 219 located on a side of the first interlayer insulating layer 218 away from the substrate 211; a second gate insulating layer 220 located on a side of the oxide semiconductor layer 219 away from the substrate 211; a gate metal layer 221 located on a side of the second gate insulating layer 220 away from the substrate 211; a second interlayer insulating layer 222 located on a side of the gate metal layer 221 away from the substrate 211; a second metal layer 223 located on a side of the second interlayer insulating layer 222 away from the substrate 211; a first flattening layer 224 located on a side of the second metal layer 223 away from the substrate 211; a third metal layer 225 located on a side of the first flattening layer 224 away from the substrate 211; a second flattening layer 226 located on a side of the third metal layer 225 away from the substrate 211; an anode layer 227 located on a side of the second flattening layer 226 away from the substrate 211; a pixel definition layer 228 located on a side of the anode layer 227 away from the substrate 211, where the pixel definition layer 228 includes multiple openings to expose anode blocks in the anode layer 227; a light emitting layer 229 located at the openings of the pixel definition layer 228; a cathode layer 230 located on a side of the light emitting layer 229 away from the substrate 211; and a thin film encapsulation layer 231 located on a side of the cathode layer 230 away from the substrate 211. The light emitting element 130 may include the anode layer 227, the light emitting layer 229 and the cathode layer 230. The light emitting element 130 may be a first light emitting element 131 or a second light emitting element 132. The light emitting element 130 may be a light emitting diode, such as an organic light emitting diode, an inorganic light emitting diode or the like. In FIG. 15, the light emitting element 130 is an organic light emitting diode, for example.

According to an embodiment of the present disclosure, an active area included in the polysilicon semiconductor layer 213, a gate included in the first metal layer 215, and a source and a drain included in the second metal layer 223 form a low temperature polysilicon thin film transistor TFT1. An active area included in the oxide semiconductor layer 219, a gate included in the gate metal layer 221, and a source and a drain included in the second metal layer 223 form an oxide semiconductor thin film transistor TFT2. A plate included in the first metal layer 215 and a plate included in the capacitor metal layer 217 form a capacitor C1. In an embodiment, the first signal line and the second signal line according to the embodiment of the present disclosure may be located in at least one of the first metal layer 215, the capacitor metal layer 217, the gate metal layer 221, the second metal layer 223 and the third metal layer 225. Different types of signal lines included in any one of the first signal line and the second signal line may be arranged in different layers or in a same layer, which is not limited in the present disclosure.

The pixel driving circuit in an embodiment of the present disclosure is configured to provide a driving signal for a light emitting element, to control the light emitting element to emit light to display an image. In conjunction with FIGS. 1 to 14, according to the present disclosure, the first display area A1 includes multiple first light emitting elements 131, and the first pixel driving circuits 110 are configured to drive the first light emitting elements 131. The second display area A2 includes multiple second pixel driving circuits 120 and multiple second light emitting elements 132, and the second pixel driving circuits 120 are configured to drive the second light emitting elements 132.

It can be understood that according to an embodiment of the present disclosure, the display light transmissive area A11 includes multiple first light emitting elements 131, and the display transition area A12 also includes multiple first light emitting elements 131. Therefore, the screen display of the first display area A1 can be realized by the first light emitting elements 131. Meanwhile, according to the embodiment of the present disclosure, the display light transmissive area A11 only includes the first light emitting elements 131, and the first pixel driving circuits 110 electrically connected to the first light emitting elements 131 in the display light transmissive area A11 are arranged in the display transition area A12. Therefore, the light transmittance in the display light transmissive area A11 can be improved, and the light collection effect can be improved.

In an embodiment of the present disclosure, a density of the second light emitting elements 132 in the second display area A2 is greater than or equal to a density of the first light emitting elements 131 in the display transition area A12. A density of the first light emitting elements 131 in the display transition area A12 is greater than or equal to a density of the first light emitting elements 131 in the display light transmissive area A11. It can be understood that the density of the first light emitting elements 131 in the display light transmissive area A11 is made smaller than the density of the first light emitting elements 131 in the display transition area A12, and it is ensured that the display light transmissive area A11 can display an image, the transmittance thereof is improved, and the display transition area A12 has a high display effect. The density of the first light emitting elements 131 in the display transition area A12 is made smaller than the density of the second light emitting elements 132 in the second display area A2, and the difficulty in light collection due to too many first light emitting elements 131 in the first display area A1 is avoided.

Figure 16:
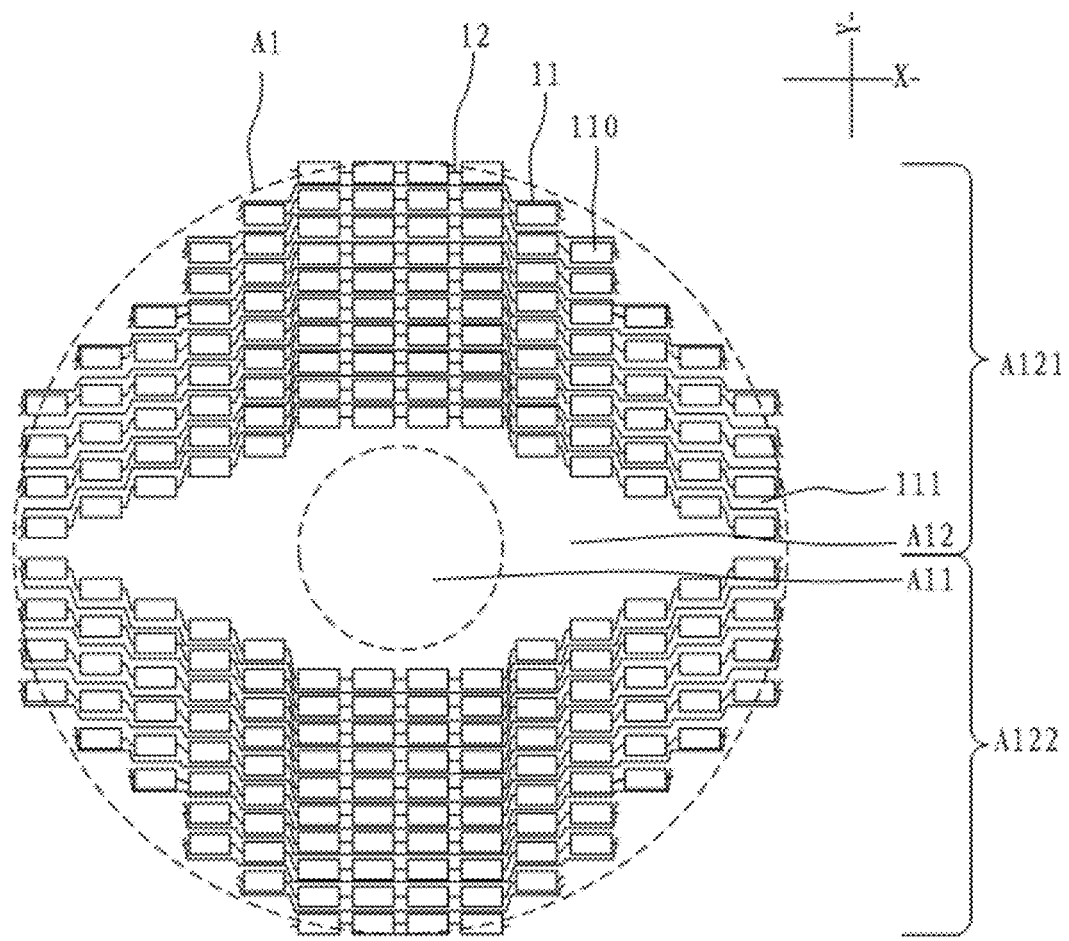
FIG. 16 is a schematic structural diagram of a first display area according to an embodiment of the present disclosure.

FIG. 16 is a schematic structural diagram of a first display area according to an embodiment of the present disclosure. According to the embodiment of the present disclosure, the display transition area A12 includes a transition sub-area located between the display light transmissive area A11 and the second display area A2. The transition sub-area includes multiple rows of first pixel driving circuits 110 arranged in the first direction Y. As shown in FIG. 16, according to the embodiment of the present disclosure, the display transition area A12 includes a transition sub-area A121 and a transition sub-area A122. Any transition sub-area includes multiple rows of first pixel driving circuits 110 arranged in the first direction Y, where multiple first pixel driving circuits 110 connected to the same second signal line 12 form one row.

It can be understood that, in the display panel according to the embodiment of the present disclosure, the number of transition sub-areas is determined by a position of the first display area A1 in the display panel. That is, the number of transition sub-areas is determined by a relative position of the first display area A1 and the second display area A2. If the first display area A1 is located within a range of the second display area A2, the display transition area A12 may include two transition sub-areas. In one embodiment, when the first display area A1 is located at an edge of the second display area A2 in the first direction Y, the display transition area A12 may include one or two transition sub-areas, which is not limited in the present disclosure.

As shown in FIG. 16, according to the embodiment of the present disclosure, the first signal line 11 is located between adjacent rows. That is, the first signal line 11 is located between adjacent rows formed by the first pixel driving circuits 110. Thus, discontinuation processing on the first signal line 11 in the first display area A1 is avoided, to ensure the high flexibility in setting the position of the first display area A1.

Figure 17:
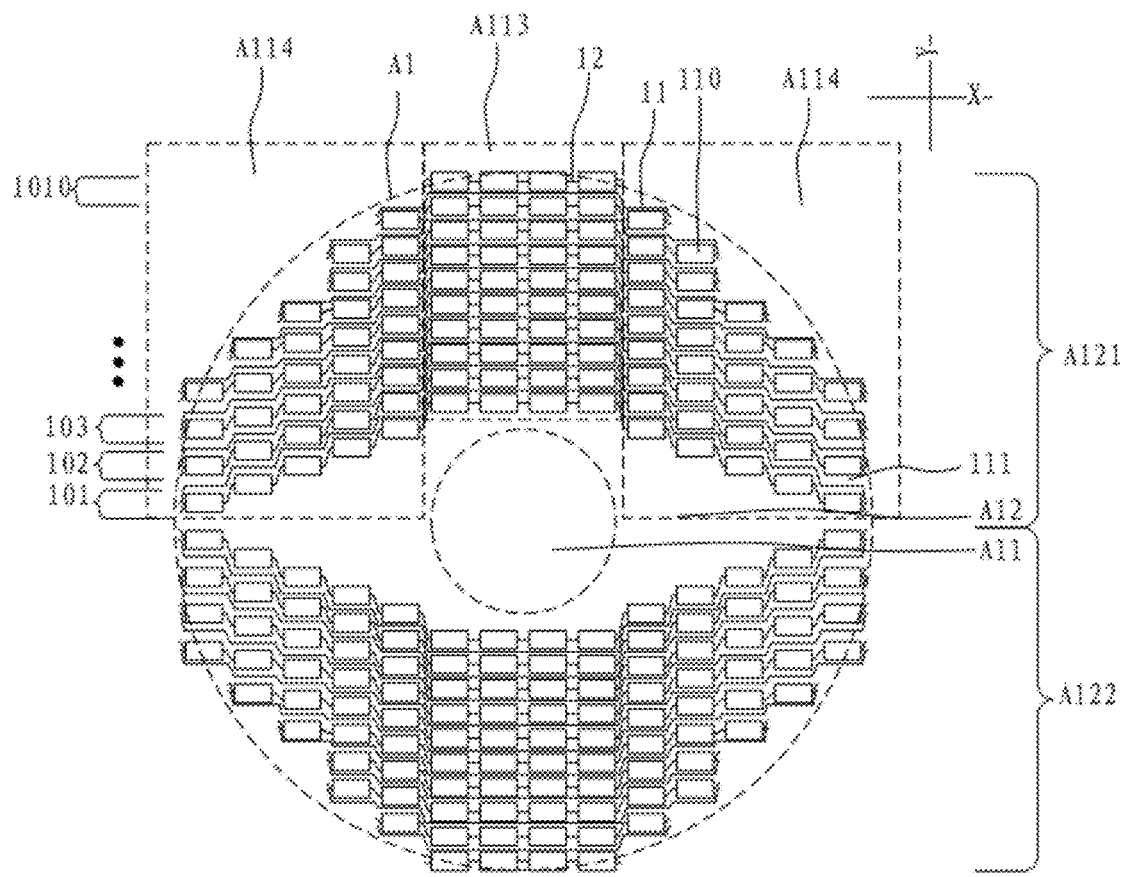
FIG. 17 is a schematic structural diagram of a first display area according to an embodiment of the present disclosure.
Figure 18:
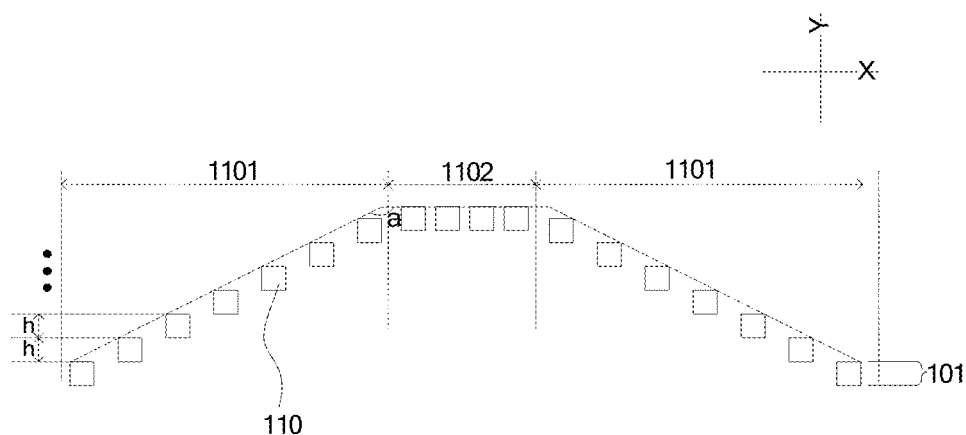
FIG. 18 is a schematic structural diagram of a row of first pixel driving circuits according to an embodiment of the present disclosure.

In conjunction with FIGS. 17 and 18, FIG. 17 is a schematic structural diagram of a first display area according to an embodiment of the present disclosure, and FIG. 18 is a schematic structural diagram of a row of first pixel driving circuits according to an embodiment of the present disclosure. According to the embodiment of the present disclosure, the transition sub-area includes a flush area A113 and an inclined area A114. A row of first pixel driving circuits 110 extending from the inclined area A114 to the flush area A113 includes an inclined portion 1101 and a flush portion 1102. The inclined portion 1101 is located in the inclined area A114, and the flush portion 1102 is located in the flush area A113, where an arrangement included angle a between the inclined portion 1101 and the flush portion 1102 is an obtuse angle.

Figure 19:
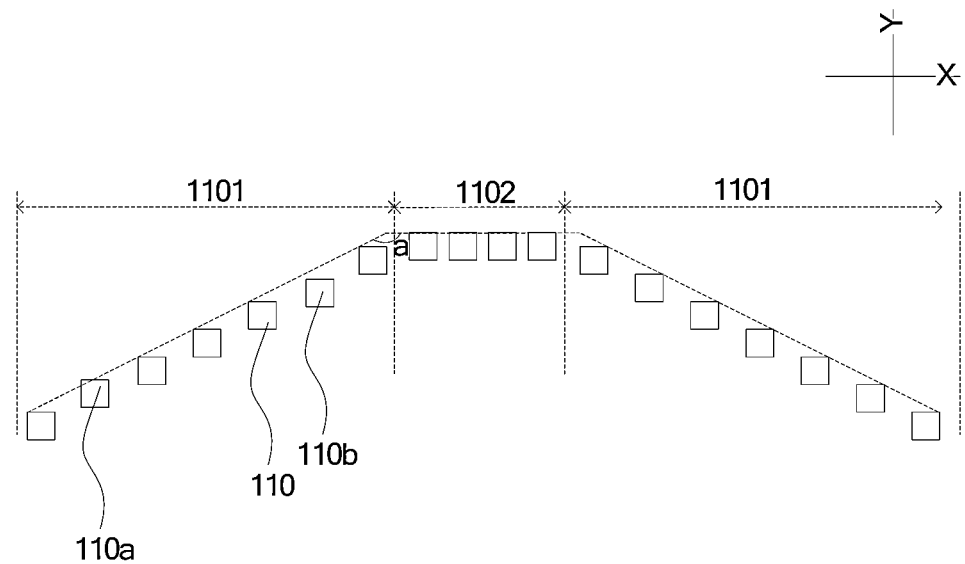
FIG. 19 is a schematic structural diagram of a row of first pixel driving circuits according to an embodiment of the present disclosure.

It can be understood that according to the embodiment of the present disclosure, the flush portion 1102 refers to multiple first pixel driving circuits 110 arranged in a horizontal direction, and the inclined portion 1101 refers to multiple first pixel driving circuits 110 arranged in an oblique direction having an included angle with the horizontal direction. As shown in FIG. 19, in a row of the first pixel driving circuits in the embodiment of the present disclosure, an included angle between the inclined portion 1101 and the flush portion 1102 is the arrangement included angle a between an arrangement direction of the first pixel driving circuits 110 of the inclined portion 1101 and an arrangement direction of the first pixel driving circuits 110 of the flush portion 1102. The arrangement direction of the first pixel driving circuits 110 of the inclined portion 1101 may be represented by a line connecting corresponding nodes of first pixel driving circuits 110 (a dashed line connecting top nodes of the first pixel driving circuits 110 in FIG. 18). It should be noted that, in a case that some particular nodes in the corresponding nodes of the first pixel driving circuits 110 are not on a same straight line, these nodes are removed, and the arrangement included angle a is determined by referring to a line connecting the remaining nodes. As shown in FIG. 19, a node of the first pixel driving circuit 110a above the dashed straight line and a node of the first pixel driving circuit 110b below the dashed line are removed, and the arrangement included angle a is determined by referring to a line connecting the nodes of the remaining first pixel driving circuits 110 on one straight line. The arrangement direction of the flush portion 1102 is the horizontal direction, and the arrangement included angle a is an included angle between the line connecting the corresponding nodes of first pixel driving circuits 110 of the inclined portion 1101 and an extension line in the horizontal direction. According to the embodiment of the present disclosure, the arrangement included angle a between the inclined portion 1101 and the flush portion 1102 is an obtuse angle. In this way, the first signal line 11 between adjacent rows can be extended from the inclined area A114 to the flush area A113 at a gentle angle, to prevent the first signal line 11 from having a steep slope, reduce breakage situations of the first signal line 11 during preparation, and avoid the occurrence of short circuit between adjacent first signal lines 11 passing through the same first pixel gap 111 due to too small interval.

In an embodiment of the present disclosure, the multiple rows of the first pixel driving circuits are defined as a first row of the first pixel driving circuits 110 to an N-th row of the first pixel driving circuits 110, and the first row of the first pixel driving circuits 110 is close to the display light transmissive area A11, where N is an integer greater than or equal to 2. The arrangement included angle a in an i-th row of the first pixel driving circuits 110 is greater than or equal to the arrangement included angle a in the first row of the first pixel driving circuits 110, where i is an integer greater than 1 and less than or equal to N. In an embodiment, the arrangement included angle in the first row of the first pixel driving circuits 110 in the embodiment of the present disclosure ranges from 144 degrees to 152 degrees, inclusive. A range of the arrangement included angle of the first row of the first pixel driving circuits 110 is optimized, to define a position and an arrangement of the first row of the first pixel driving circuits 110, and provide a key parameter for a layout of the first pixel driving circuits 110 in other subsequent rows. While determining the position of the first row of the first pixel driving circuits 110, a position of the last row of the first pixel driving circuits 110 may also be determined. For remaining (except the first and last rows) first pixel driving circuits 110 located in a same column, positions of the remaining first pixel driving circuits 110 may be determined in an equidistant manner based on the position of the first row of the first pixel driving circuits 110 and the position of the last row of the first pixel driving circuits 110. In this way, for first pixel driving circuits located in the same column, the interval between adjacent first pixel driving circuits 110 will not be too large. Accordingly, in a case that a portion of the first signal line 11 corresponding to the first pixel driving circuits 110 in the column extends to a position corresponding to the first pixel driving circuits 110 in a previous column or extends to a position corresponding to the first pixel driving circuits 110 in a next column, the inclined line segment of the first signal line 11 will not have a steep slope, and the occurrence of a short circuit between adjacent first signal lines 11 is avoided.

According to an embodiment of the present disclosure, in a direction from the first row of the first pixel driving circuits 110 to the N-th row of the first pixel driving circuits 110, the arrangement included angle a is gradually increased. Thus, the first signal line 11 between the first pixel driving circuits 110 in two adjacent rows is smoother, and breakage situations of the first signal line 11 during preparation are further reduced.

Further, as shown in FIGS. 17 and 18, in any transition sub-area, the multiple rows of the first pixel driving circuits 110 are defined as a first row 101 of the first pixel driving circuits 110 to an N-th row 10N (in FIGS. 17 and 18, N is 10 as an example for description, that is, N=10) of the first pixel driving circuits 110, and the first row 101 of the first pixel driving circuits 110 is close to the display light transmissive area A11, where N is an integer greater than or equal to 2. For the inclined portion 1101 in the first row 101 of the first pixel driving circuits 110, all the intervals h between adjacent first pixel driving circuits 110 in the first direction Y are the same, to define a position and an interval parameter of the first row 101 of the first pixel driving circuits 110, and lay a foundation for a subsequent optimal design of positions of the first pixel driving circuits 110 in the remaining rows.

Figure 20:
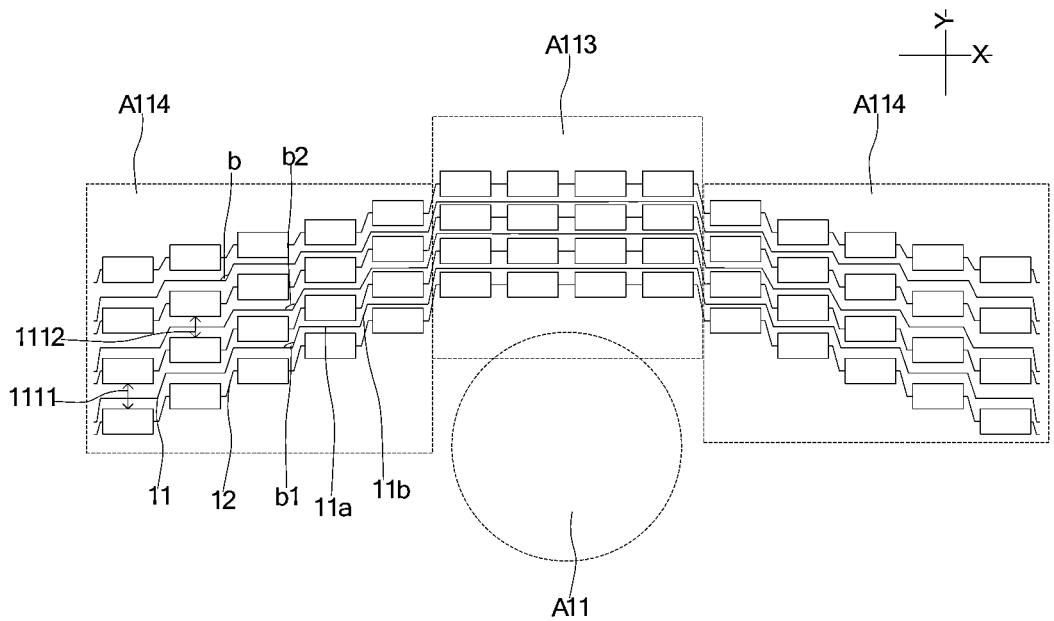
FIG. 20 is a schematic structural diagram of multiple adjacent rows of first pixel driving circuits according to an embodiment of the present disclosure.

In an embodiment of the present disclosure, in the first pixel driving circuits 110 in a same column in the present disclosure, lengths of all the first pixel gaps 111 in the first direction Y are the same. FIG. 20 is a schematic structural diagram of multiple adjacent rows of first pixel driving circuits according to an embodiment of the present disclosure. The transition sub-area includes multiple columns of the first pixel driving circuits 110 arranged in the second direction X. In the inclined area A114, for the first pixel driving circuits 110 in a same column, lengths of all the first pixel gaps 111 in the first direction Y are the same. For example, in the inclined area A114 on either side of the flush area A113 shown in FIG. 20, in a direction from the inclined area A114 to the flush area A113, all the first pixel gaps 1111 in a first column of the first pixel driving circuits 110 are the same, all the first pixel gaps 1112 in a second column of the first pixel driving circuits 110 are the same, and in a similar fashion, all the first pixel gaps 111 in the first pixel driving circuits 110 in the same column are the same. Thus, it is convenient for a wiring design of the lines in the first display area A1. For the first pixel driving circuits in different columns, the first pixel gaps may be different.

Further, for all first pixel gaps 111 located between adjacent rows, in a direction from the inclined area A114 to the flush area A113, lengths of the first pixel gaps 111 in the first direction Y are gradually decreased. For example, as shown in FIG. 20, the first pixel gap 1111 in the first column of the first pixel driving circuits 110 is larger than the first pixel gap 1112 in the second column of the first pixel driving circuits 110. Thus, the arrangement included angle between the inclined portion 1101 and the flush portion 1102 of the first pixel driving circuits 110 in each row is an obtuse angle.

In an embodiment of the present disclosure, the first signal line 11 in the present disclosure may pass through the first pixel gap 111 between the first pixel driving circuits 110 in adjacent rows as a curved line in the inclined area A114. In one embodiment, the first signal line 11 in the present disclosure may pass through the first pixel gap 111 between the first pixel driving circuits 110 in adjacent rows as a polyline in the inclined area A114. As shown in FIG. 20, in the inclined area A114, the first signal line 11 includes a straight line segment 11a and an inclined line segment 11b connected to each other. In the first direction Y, the straight line segment 11a overlaps with the first pixel driving circuit 110. That is, the straight line segment 11a is located between adjacent first pixel driving circuits 110 in the first direction Y. The inclined line segment 11b connects two adjacent straight line segments 11a.

In the inclined area A114, the second signal line 12 may include a straight line segment and an inclined line segment connected to each other, and the inclined line segment connects two adjacent straight line segments. At least a part of the straight line segment of the second signal line 12 (not shown in FIG. 20) passes through an area of the first pixel driving circuit 110.

As shown in FIG. 20, according to an embodiment of the present disclosure, an included angle b between the inclined line segment 11b and the straight line segment 11a is in the range of [150°, 180°). The included angle between the inclined line segment 11b and the straight line segment 11a is an angle at the crossing of the inclined line segment 11b and the straight line segment 11a and at a side away from the display light transmissive area A11. The angle is set to the range of [150°, 180°), to reduce breakage situations of the first signal line 11 during preparation.

Further, referring to FIG. 20, in the inclined area A114, in a direction from the display light transmissive area A11 to the inclined area A114, the included angle b between the inclined line segment 11b and the straight line segment 11a is gradually increased. For example, an included angle b1 of the first signal line 11 between the first pixel driving circuits 110 in previous adjacent rows is smaller than an included angle b2 of the first signal line 11 between the first pixel driving circuits 110 in next adjacent rows. Thus, a polyline portion of the first signal line 11 is smoother, and a probability of breakage of the first signal line 11 during preparation is further reduced.

Figure 21:
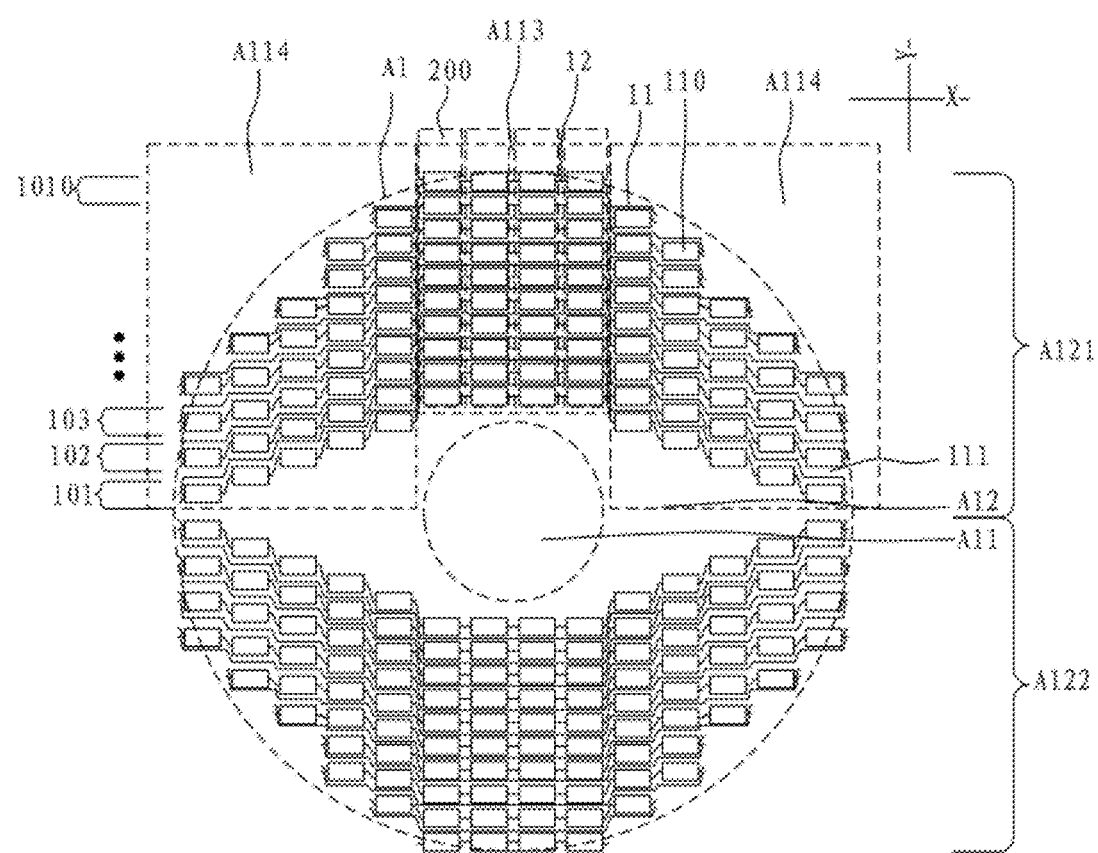
FIG. 21 is a schematic structural diagram of a first display area according to an embodiment of the present disclosure.

FIG. 21 is a schematic structural diagram of a first display area according to an embodiment of the present disclosure. According to the embodiment of the present disclosure, the transition sub-area includes multiple columns 200 of the first pixel driving circuits 110 arranged in the second direction X. In an embodiment, in the flush area A113, the number of the first pixel driving circuits 110 in each column 200 is the same. As shown in FIG. 21, according to the embodiment of the present disclosure, the number of the first pixel driving circuits 110 in each column 200 is the same. In FIG. 21, the description is made by taking the number of the first pixel driving circuits 110 in each column 200 being 10 as an example, which is not limited in the present disclosure, and may be designed according to practical applications.

Figure 22:
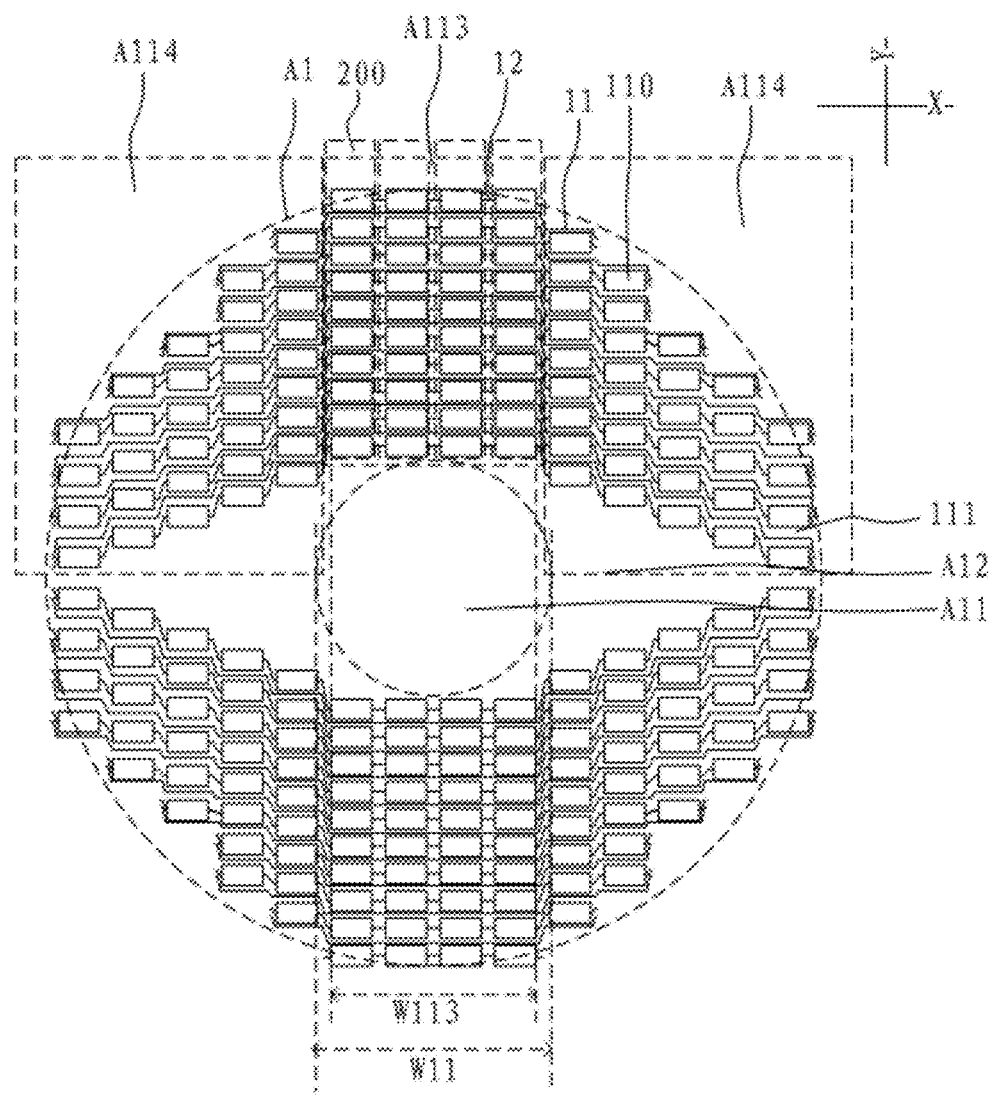
FIG. 22 is a schematic structural diagram of a first display area according to an embodiment of the present disclosure.

FIG. 22 is a schematic structural diagram of a first display area according to an embodiment of the present disclosure. The relationship between a width W113 of the flush area A113 in the second direction X and a width W11 of the display light transmissive area A11 in the second direction X may include: W113<W11, or W113=W11, or W113>W11. In a case that W113<W11, the first pixel driving circuit 110 located in the flush area A113 and the first pixel driving circuit 110 located in the inclined area A114 may jointly form a polyline shape surrounding the display light transmissive area A11. The display light transmissive area A11 may be circular.

In an embodiment of the present disclosure, for the multiple columns of the first pixel driving circuits 110 located in the inclined area A114, in a direction from the inclined area A114 to the flush area A113, the number of the first pixel driving circuits 110 in a next column is greater than or equal to the number of the first pixel driving circuits 110 in a previous column. It should be noted that, in the transition sub-area in the embodiment of the present disclosure, the number of the first pixel driving circuits 110 in each column and the number of the first pixel driving circuits 110 in each row are not limited, which are analyzed and designed based on factors such as an outer contour of the first display area A1 and a type of display device. For example, after the outer contour of the first display area A1 is determined, the number and positions of the first pixel driving circuits 110 in the first display area A1 of this contour is determined, to finally obtain a wiring structure in the first display area A1. In an embodiment, the outer contour of the first display area A1 in the embodiment of the present disclosure may be a circle, an ellipse, a rectangle, a diamond, or the like.

Figure 23:
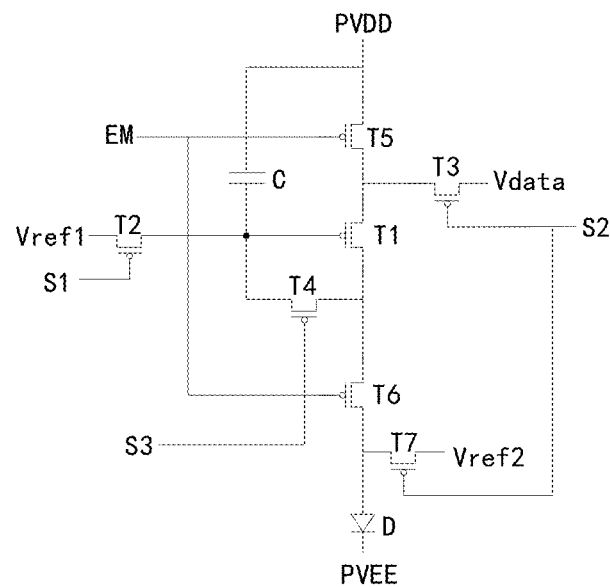
FIG. 23 is a schematic structural diagram of a pixel driving circuit according to an embodiment of the present disclosure.
Figure 24:
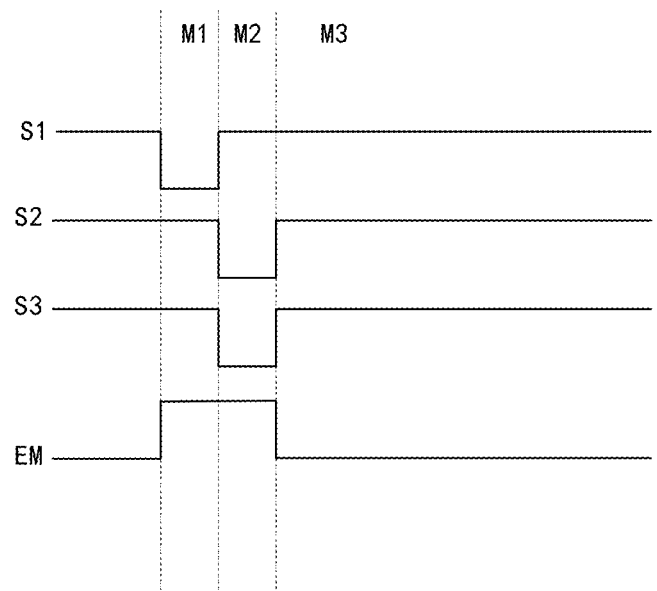
FIG. 24 is a timing diagram according to an embodiment of the present disclosure.

In an embodiment of the present disclosure, a type of the pixel driving circuit is not limited in the present disclosure. A structure of the pixel driving circuit in an embodiment of the present disclosure is described below. FIG. 23 is a schematic structural diagram of a pixel driving circuit according to an embodiment of the present disclosure. According to the embodiment of the present disclosure, the first pixel driving circuit and/or the second pixel driving circuit may be a 7T1C circuit. That is, the pixel driving circuit includes seven transistors and one capacitor, including a driving transistor T1, a data writing transistor T3 electrically connected to the driving transistor T1, and a second reset transistor T7 electrically connected to an anode of a light emitting element D. In one embodiment, the first pixel driving circuit (or the second pixel driving circuit) includes a driving transistor T1, a first reset transistor T2, a data writing transistor T3, a connection transistor T4, a first light emitting control transistor T5, a second light emitting control transistor T6, a second reset transistor T7 and a storage capacitor C. A gate of the driving transistor T1 is electrically connected to a second end of the first reset transistor T2, a second end of the connection transistor T4 and a second end of the storage capacitor C. A first end of the driving transistor T1 is electrically connected to a second end of the first light emitting control transistor T5 and a second end of the data writing transistor T3. A second end of the driving transistor T1 is electrically connected to a first end of the connection transistor T4 and a first end of the second light emitting control transistor T6.

A first end of the first reset transistor T2 is connected to a first reset voltage Vref1, and a gate of the first reset transistor T2 is connected to a first scanning control signal S1. A first end of the data writing transistor T3 is connected to a data voltage Vdata, a gate of the data writing transistor T3 is connected to a second scanning control signal S2, and the data voltage Vdata may be provided by a data signal line. A gate of the connection transistor T4 is connected to a third scanning control signal S3. The first scanning control signal S1, the second scanning control signal S2 and the third scanning control signal S3 are provided by a scanning control signal line. A first end of the first light emitting control transistor T5 and a first end of the storage capacitor C are both connected to a first power supply voltage PVDD. A gate of the first light emitting control transistor T5 is connected to a light emitting control signal EM. A second end of the second light emitting control transistor T6 is electrically connected to an anode of the light emitting element D, and a gate of the second light emitting control transistor T6 is connected to the light emitting control signal EM. A first end of the second reset transistor T7 is connected to a second reset voltage Vref2, a second end of the second reset transistor T7 is electrically connected to the anode of the light emitting element D, and a gate of the second reset transistor T7 is connected to the second scanning control signal S2. A cathode of the light emitting element D is connected to a second power supply voltage PVEE. The first reset voltage Vref1 and the second reset voltage Vref2 may be provided by a reset signal line.

It can be understood that according to the embodiment of the present disclosure, the gate of the data writing transistor T3 and the gate of the second reset transistor T7 are both connected to the second scanning control signal S2. That is, according to the embodiment of the present disclosure, the gate of the data writing transistor T3 is connected to the gate of the second reset transistor T7, to reduce the number of wirings of the first pixel driving circuit. Further, according to the embodiment of the present disclosure, the second reset transistor T7 may be located in an area between at least two transistors in the first pixel driving circuit on the layout. As shown in FIG. 3, the second reset transistor T7 is located between the first reset transistor T2 and the data writing transistor T3, etc. (which is not limited in the present disclosure). Thus, an area occupied by the first pixel driving circuit can be reduced, and an effective wiring area in the first display area can be increased.

In an embodiment of the present disclosure, all transistors in the first pixel driving circuit in the present disclosure may be P-type transistors or N-type transistors, which is not limited in the present disclosure. As shown in FIG. 23, in the embodiment of the present disclosure, the description is given by taking all transistors being P-type transistors as an example. For an operation process of each transistor in a reset phase M1, a data writing phase M2 and a light emitting phase M3 of the first pixel driving circuit, reference may be made to a timing diagram shown in FIG. 24.

In FIG. 23, the first reset transistor T2 and the connection transistor T4 are P-type transistors, and the P-type transistors may be low temperature polysilicon thin film transistors, for example. In another embodiment, the first reset transistor and the connection transistor may also be N-type transistors, and are oxide semiconductor transistors, which can mitigate a leakage current problem of the transistors. In a case that the first reset transistor and the connection transistor are N-type transistors, an enabling level of a corresponding scanning control signal is a high level.

In a case that the display panel is in a low frequency operation mode, the first scanning control signal S1 and the third scanning control signal S3 do not provide an enabling signal, and the second scanning control signal S2 provides an enabling signal. A timing of the second scanning control signal S2 is different from a timing of the third scanning control signal S3, and the scanning control signals of adjacent pixel rows may not be used. Therefore, each row of pixel driving circuits is required to be separately provided with a scanning control signal line for providing the second scanning control signal S2. The first signal line 11 includes a scanning control signal line. The scanning control signal line may pass through the first display area via the first pixel gap in the first display area A1, and connect scanning control signal lines on both sides of the first display area A1, which is beneficial to load balance on the scanning control signal lines of different rows.

Figure 25:
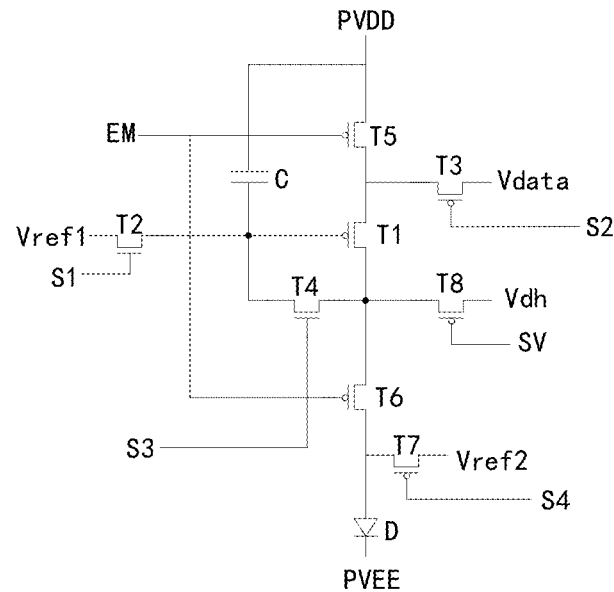
FIG. 25 is a schematic structural diagram of a pixel driving circuit according to an embodiment of the present disclosure.
Figure 26:
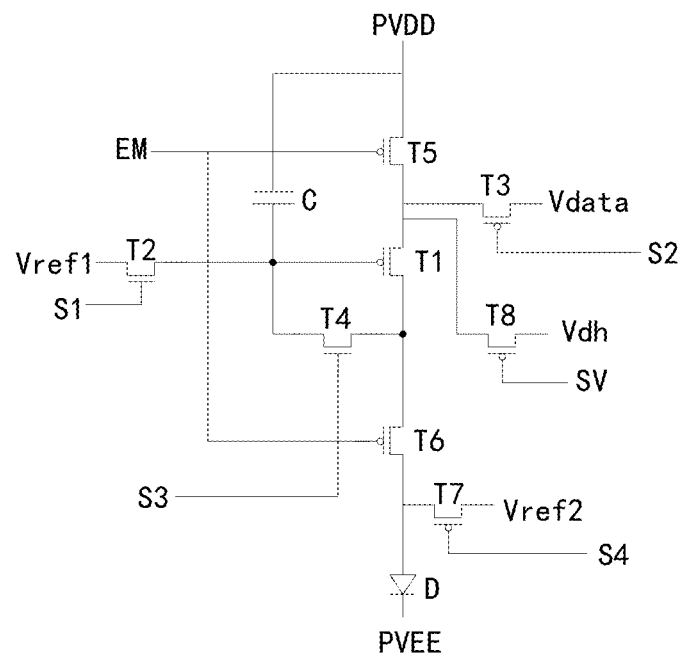
FIG. 26 is a schematic structural diagram of a pixel driving circuit according to an embodiment of the present disclosure.
Figure 27:
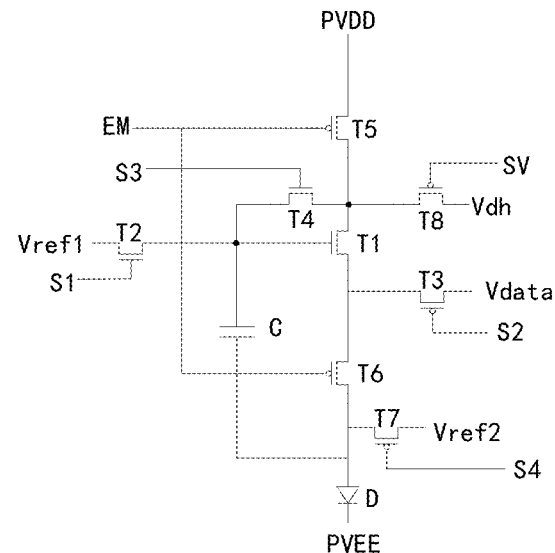
FIG. 27 is a schematic structural diagram of a pixel driving circuit according to an embodiment of the present disclosure.
Figure 28:
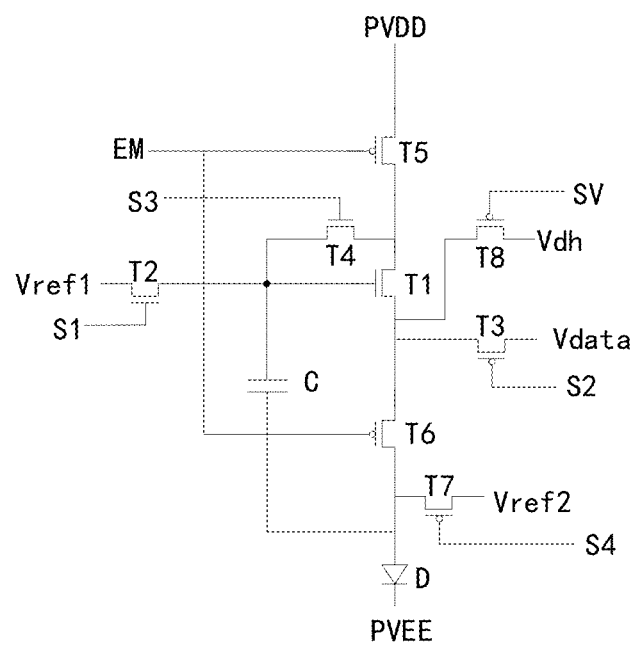
FIG. 28 is a schematic structural diagram of a pixel driving circuit according to an embodiment of the present disclosure.

Referring to FIGS. 25 to 28, the pixel driving circuit may also be an 8T1C type pixel circuit. That is, the pixel driving circuit includes eight transistors and one capacitor. According to an embodiment of the present disclosure, the pixel driving circuit further includes a bias compensation transistor T8. A gate of the bias compensation transistor T8 is connected to a bias control signal SV, a first end of the bias compensation transistor T8 is connected to a bias compensation voltage Vdh, and a second end of the bias compensation transistor T8 is electrically connected to a first end of a driving transistor T1, as shown in FIGS. 26 and 27. In one embodiment, a second end of the bias compensation transistor T8 is electrically connected to a second end of a driving transistor T1, as shown in FIGS. 25 and 28. According to the embodiment of the present disclosure, the bias compensation transistor T8 is configured to transmit the bias compensation voltage Vdh to the first pixel driving circuit before the data writing phase M2, or after the data writing phase M2 and before the light emitting phase M3, to improve a hysteresis characteristic of the driving transistor T1. In one embodiment, the bias compensation transistor T8 is configured to transmit the bias compensation voltage Vdh to a source or a drain of the driving transistor T1 in a display frame without the data writing phase, to improve a bias state of the driving transistor T1. The bias compensation voltage Vdh is provided by a bias signal line, and the bias signal line may be the first signal line and the second signal line in the present disclosure. In FIGS. 25 and 26, the driving transistor is a P-type transistor, for example. In FIGS. 27 and 28, the driving transistor is an N-type transistor, for example.

In FIGS. 25 to 28, the first reset transistor T2 and the connection transistor T4 are, for example, N-type transistors, in one embodiment, oxide semiconductor transistors, to reduce a leakage current phenomenon of the transistors. In another embodiment, the first reset transistor T2 and the connection transistor T4 may be P-type transistors and are low temperature polysilicon transistors.

In FIGS. 25 to 28, a gate of the data writing transistor T3 is connected to a second scanning control signal S2, and a gate of the second reset transistor T7 is connected to a fourth scanning control signal S4. If the second scanning control signal S2 is the same as the fourth scanning control signal S4, the gate of the data writing transistor T3 may be connected to the gate of the second reset transistor T7. The scanning control signal may be provided by using the same scanning control signal line to reduce the number of wirings of the pixel driving circuit.

Figure 29:
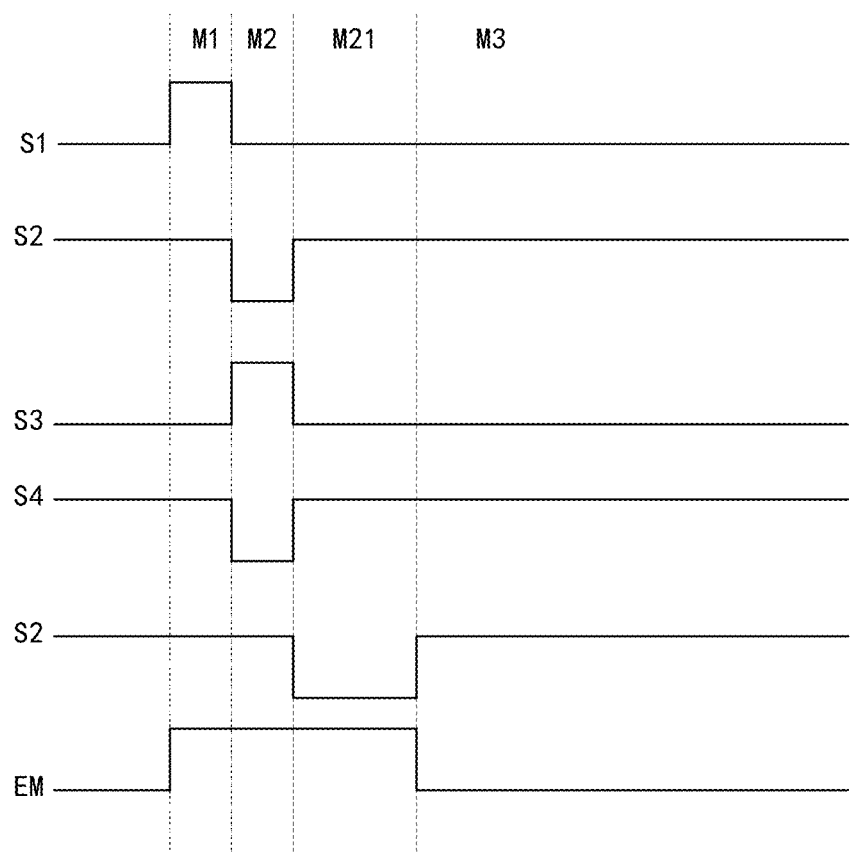
FIG. 29 is a timing diagram according to an embodiment of the present disclosure.

FIG. 29 is a timing diagram of the pixel driving circuit shown in FIG. 25. For an operation process of each transistor in a reset phase M1, a data writing phase M2, a bias compensation phase M21 and a light emitting phase M3 of the pixel driving circuit, reference may be made to the timing diagram shown in FIG. 29. A timing and length of the bias compensation phase M21 may be adjusted as needed.

The pixel driving circuit includes P-type transistors and N-type transistors. Even if the timing is the same, due to the different enabling levels of the transistors, the number of control signals required by the pixel driving circuit is increased. That is, the number of signal lines connected to the pixel driving circuit is increased. In addition, since at least some of the control signals may not use the signals in the adjacent pixel driving circuit rows, the signal line connected to each row of pixel driving circuits are required to be set separately. In the first display area A1, the first signal line connected to a specific pixel driving circuit row is arranged in the first pixel gap, which reduces a wiring difficulty of the signal line in the first display area A1, and at the same time helps balance the loads on the signal lines connected to the pixel driving circuits in different rows.

It should be noted that the control signals S1 to S4 can be understood as the scanning control signals mentioned above, and EM can be understood as the light emitting control signals mentioned above.

In an embodiment, the bias compensation transistor T8 in an embodiment of the present disclosure may be located in an area between at least two transistors in the first pixel driving circuit on the layout. For example, the bias compensation transistor T8 is located between the first reset transistor T2 and the data writing transistor T3, etc. (which is not limited in the present disclosure). Thus, an area occupied by the first pixel driving circuit can be reduced, and an effective wiring area in the first display area can be increased.

Figure 30:
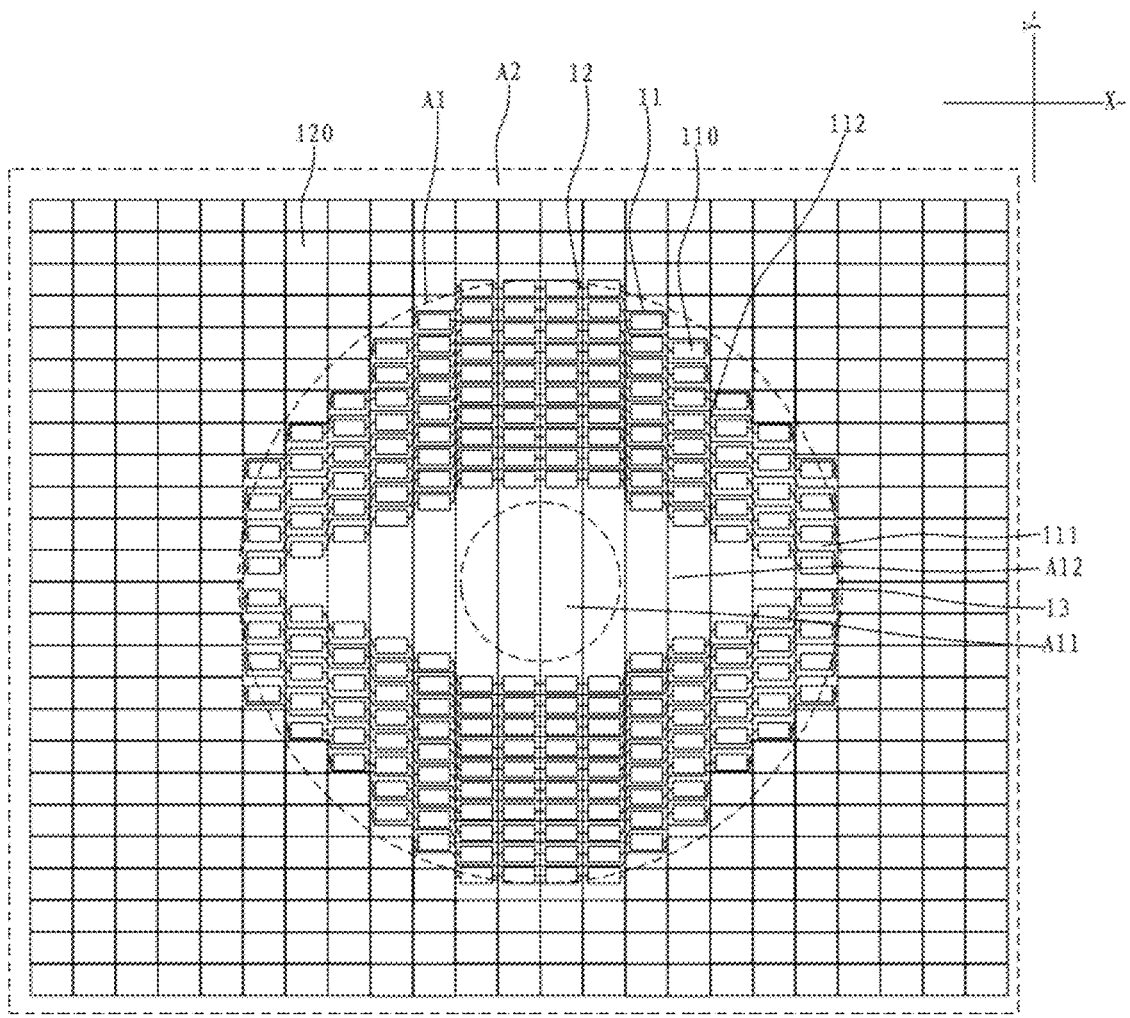
FIG. 30 is a schematic structural diagram of a display panel according to an embodiment of the present disclosure.

FIG. 30 is a schematic structural diagram of a display panel according to an embodiment of the present disclosure. In the second direction X and in any row of the first pixel driving circuits 110, a second pixel gap 112 is present between two adjacent first pixel driving circuits 110. The display transition area A12 includes multiple third signal lines 13 extending in the first direction Y and electrically connected to the first pixel driving circuits 110. Each of the third signal lines 13 is located in the second pixel gap 112, to further optimize the wiring structure of the display panel.

In an embodiment of the present disclosure, the third signal line 13 in the present disclosure in the display light transmissive area A11 may pass through the display light transmissive area A11 or avoid the display light transmissive area A11 by taking a detour, which is not limited in the present disclosure. According to an embodiment of the present disclosure, in the first display area A1, in the transition sub-area, for a row of the first pixel driving circuits 110, lengths of all the second pixel gaps 112 in a third direction (where the second direction X may be perpendicular to the first direction Y; in this case, the third direction is the second direction X) are the same. The third direction is perpendicular to the first direction Y.

In an embodiment, the third signal line in the embodiment of the present disclosure is a reset signal line, a data signal line or a power line. The reset signal line is a signal line for providing a first reset voltage Vref1 and a second reset voltage Vref2 for the pixel driving circuit. The data signal line is a signal line for providing a data voltage Vdata for the pixel driving circuit. The power line is a signal line for providing a power supply voltage PVDD for the pixel driving circuit.

Figure 31:
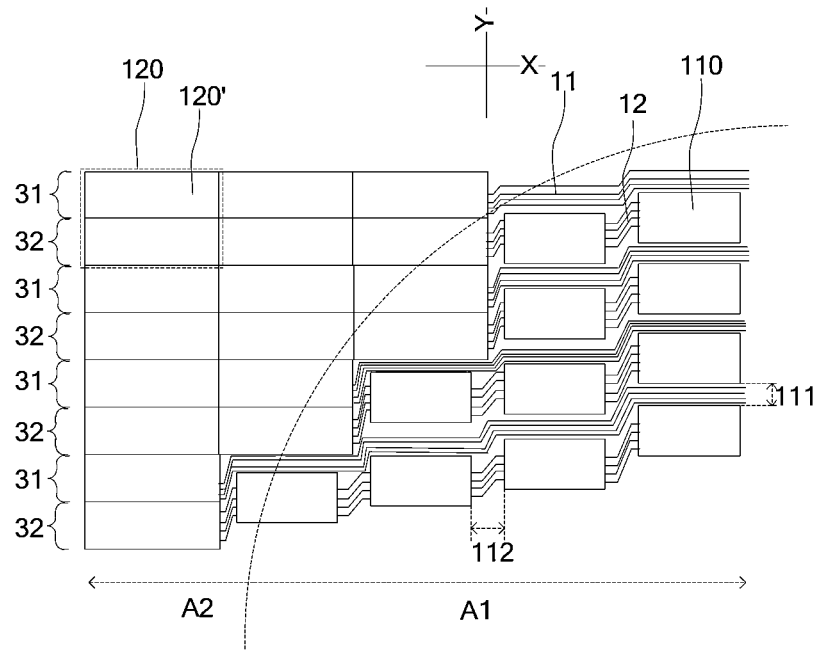
FIG. 31 is a partial schematic structural diagram of a display panel according to an embodiment of the present disclosure.

FIG. 31 is a partial schematic structural diagram of a display panel according to an embodiment of the present disclosure. The second display area includes multiple second pixel driving circuits 120. The display panel further includes multiple second signal lines 12 extending in the second direction X. The first signal line 11 is electrically connected to the second pixel driving circuit 120, and each of the second signal lines 12 is electrically connected to the first pixel driving circuit 110 and the second pixel driving circuit 120. The second pixel driving circuits 120 electrically connected to the first signal line 11 form a first group of pixel driving circuits 31. The second pixel driving circuits 120 electrically connected to the second signal line 12 form a second group of pixel driving circuits 32. The first group of pixel driving circuits 31 and the second group of pixel driving circuits 32 are alternately arranged in the first direction Y. The second pixel driving circuit 120 may include pixel driving sub-circuits 120' arranged in two rows. The first signal line 11 is connected to one row of pixel driving sub-circuits 120' of the second pixel driving circuit 120 (e.g., pixel driving sub-circuits 120' in the first group of pixel driving circuits 31). The second signal line 12 is connected to the other row of pixel driving sub-circuits 120' of the second pixel driving circuit 120 (e.g., pixel driving sub-circuits 120' in the second group of pixel driving circuits 32).

Figure 32:
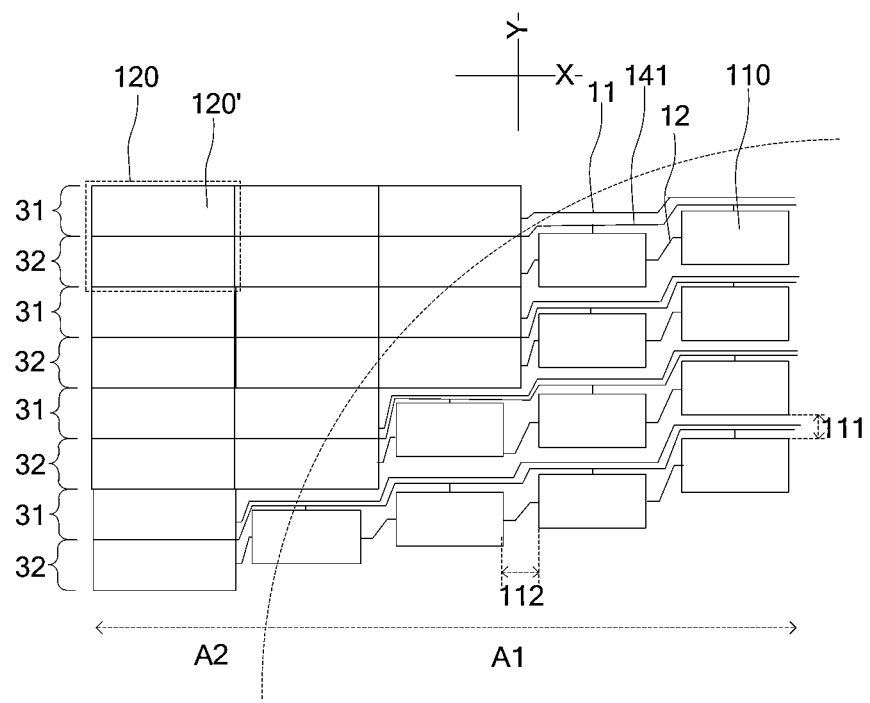
FIG. 32 is a partial schematic structural diagram of a display panel according to an embodiment of the present disclosure.

Further reference is made to FIG. 32, which is a partial schematic structural diagram of a display panel according to an embodiment of the present disclosure. The display panel further includes multiple first bias voltage lines 141 extending in the second direction X for transmitting the bias compensation voltage Vdh described above. In the second display area A2, each of the first bias voltage lines 141 is located between and electrically connected to the first group of pixel driving circuits 31 and the second group of pixel driving circuits 32 that are adjacent to each other. The first bias voltage line 141 extends from the second display area A2 to the first display area A1. In the first display area A1, the first bias voltage line 141 is electrically connected to the first pixel driving circuit 110.

In an embodiment of the present disclosure, both the first signal line 11 and the second signal line 12 in the present disclosure include a first bias voltage line 141. In the first display area A1, the first bias voltage line 141 in the first signal line 11 is located in the first pixel gap 111. According to the present disclosure, a line width of the first bias voltage line 141 in the first display area A1 is smaller than a line width of the first bias voltage line 141 in the second display area A2, to improve the uniformity of all the first bias voltage lines 141 and ensuring a high signal transmission performance.

Figure 33:
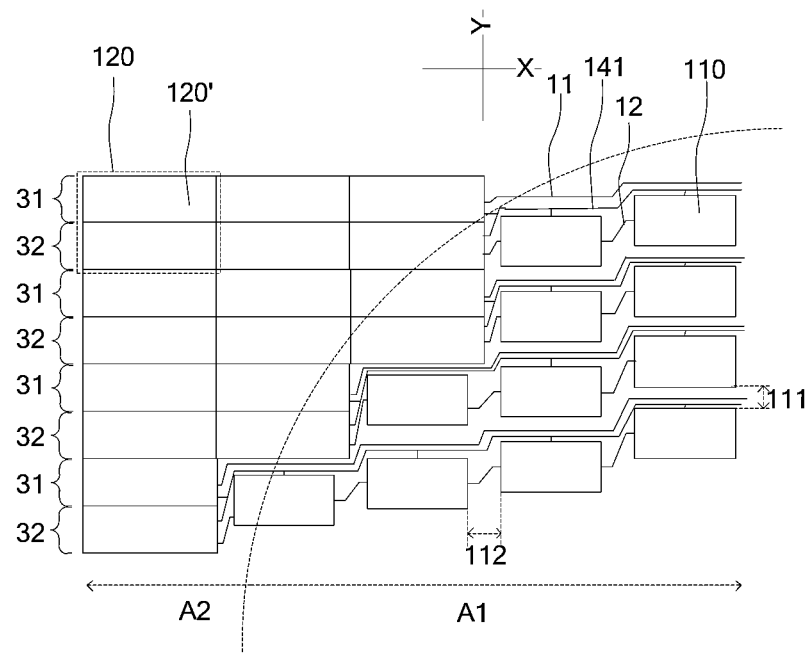
FIG. 33 is a partial schematic structural diagram of a display panel according to an embodiment of the present disclosure.

FIG. 33 is a partial schematic structural diagram of a display panel according to an embodiment of the present disclosure. The display panel further includes multiple first bias voltage lines 141 extending in the second direction X for transmitting the bias compensation voltage Vdh described above. In the second display area A2, the first group of pixel driving circuits 31 and the second group of pixel driving circuits 32 each are electrically connected to one of the first bias voltage lines 141. At a junction of the second display area A2 and the first display area A1, two adjacent first bias voltage lines 141 are merged into one first bias voltage line and extend to the first display area A1. In the first display area A1, the first bias voltage line 141 is electrically connected to the first pixel driving circuit 110. Thus, by merging the first bias voltage lines 141, the number of wirings is reduced, and a larger wiring space of the first display area A1 is guaranteed as well.

Figure 34:
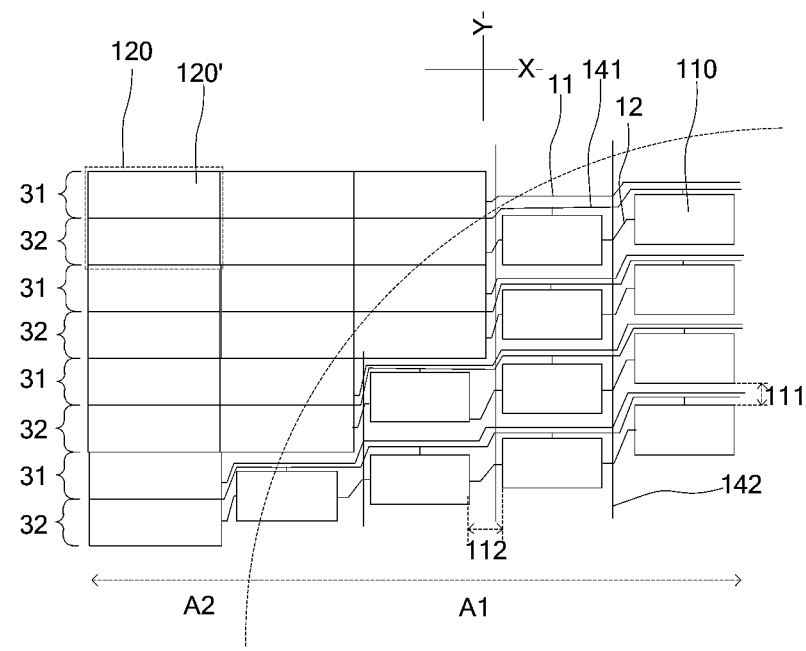
FIG. 34 is a partial schematic structural diagram of a display panel according to an embodiment of the present disclosure.

FIG. 34 is a partial schematic structural diagram of a display panel according to an embodiment of the present disclosure. The display panel in the embodiment of the present disclosure further includes multiple second bias voltage lines 142 extending in the first direction Y. In the first display area A1, the multiple first pixel driving circuits 110 are arranged in multiple columns in the second direction X, a second pixel gap 112 is provided between two adjacent columns, and the second bias voltage line 142 is located in the second pixel gap 112. The first bias voltage lines 141 and the second bias voltage lines 142 are arranged in a grid shape, to better provide a voltage signal for the pixel driving circuit.

Accordingly, a display device is further provided according to an embodiment of the present disclosure, which includes the display panel according to any one of the above embodiments.

Figure 35:
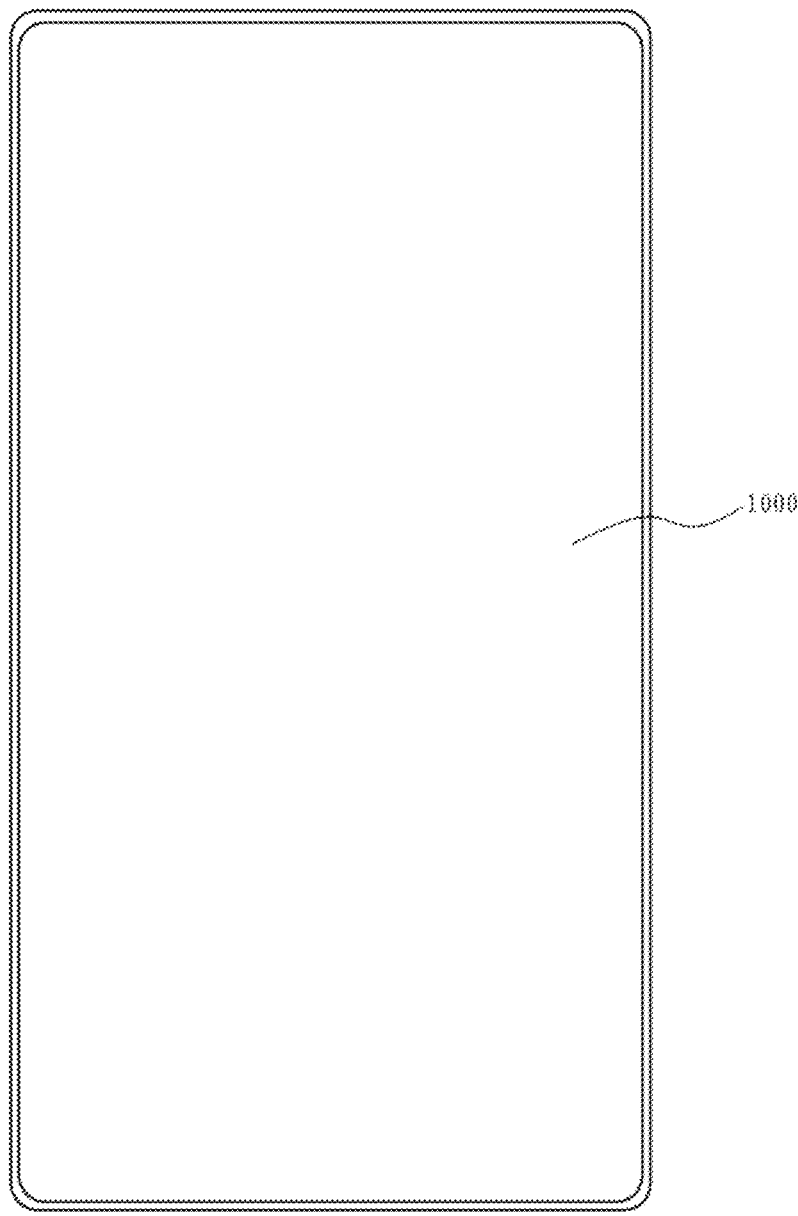
FIG. 35 is a schematic structural diagram of a display device according to an embodiment of the present disclosure.

FIG. 35 is a schematic structural diagram of a display device according to an embodiment of the present disclosure. The display device 1000 in the embodiment of the present disclosure may be a mobile terminal device.

In an embodiment, the display device in the present disclosure may also be an electronic display device such as a computer and a wearable display device, which is not limited in the present disclosure.

In an embodiment of the present disclosure, the display device in the present disclosure includes an optical sensor arranged corresponding to the display light transmissive area, such as a camera, which may be arranged on a back side of the display panel and overlap with the display light transmissive area of the display panel. In one embodiment, in the display light transmissive area in the embodiment of the present disclosure, other photosensitive elements may also be arranged, which may be designed according to a type of the display device.

A display panel and a display device are provided according to embodiments of the present disclosure. The display panel includes a first display area and a second display area. The first display area includes a display light transmissive area and a display transition area located between the display light transmissive area and the second display area. The first display area includes multiple first pixel driving circuits, and the multiple first pixel driving circuits are located in the display transition area. In a first direction, a first pixel gap is present between two adjacent first pixel driving circuits. The display panel further includes multiple first signal lines extending in a second direction. Each of the first signal lines extends from the second display area through the display transition area. In the display transition area, the first signal line passes through the first pixel gap. The first direction and the second direction intersect with each other.

As can be seen from the above description, in the embodiments of the present disclosure, a first pixel driving circuit is arranged in a display transition area, and the influence of the first pixel driving circuit on a display light transmissive area is avoided, and the light transmittance of the display light transmissive area is improved. Meanwhile, a first pixel gap is arranged between adjacent first pixel driving circuits located in a first display area, to ensure that a first signal line passes through the first display area from the first pixel gap, without the need to perform discontinuation processing on the first signal line in the first display area, and the problem of load difference between two discontinued wirings due to the discontinuation of the first signal line is avoided, to eliminate the position restriction of the first display area, and providing innovation for the development of the technology of using under-screen devices.

What is claimed is:

1. A display panel, comprising a first display area and a second display area, wherein the first display area comprises a display light transmissive area and a display transition area located between the display light transmissive area and the second display area;
the first display area comprises a plurality of first pixel driving circuits, and the plurality of first pixel driving circuits are located in the display transition area;
the display transition area comprises a transition sub-area located between the display light transmissive area and the second display area, wherein in the transition sub-area, the plurality of first pixel driving circuits are distributed in a plurality of rows, the plurality of rows of the first pixel driving circuits are defined as a first row of the first pixel driving circuits to an N-th row of the first pixel driving circuits, and the first row of the first pixel driving circuits are located at a side of the N-th row of the first pixel driving circuits closer to the display light transmissive area, wherein N is an integer greater than or equal to 2;
the transition sub-area comprises a flush area and an inclined area that are located in one plane, a row of the first pixel driving circuits extending from the inclined area to the flush area comprises an inclined portion and a flush portion, the inclined portion is located in the inclined area, and the flush portion is located in the flush area, wherein an included angle between the inclined portion and the flush portion is an obtuse angle; and
for at least three adjacent first pixel driving circuits in an inclined portion in the first row of the first pixel driving circuits, all intervals between the at least three adjacent first pixel driving circuits in the first direction are the same, wherein the first direction is perpendicular to a direction in which first pixel driving circuits in the flush area are distributed.

2. The display panel according to claim 1, wherein for the first row of the first pixel driving circuits, first pixel driving circuits in the inclined portion are distributed along a first straight line, first pixel driving circuits in the flush portion are distributed along a second straight line, and the first straight line intersects with the second straight line.

3. The display panel according to claim 1, wherein in the transition sub-area, the plurality of first pixel driving circuits are distributed in a plurality of columns, each column of the first pixel driving circuits are distributed along the first direction, and in the first direction, a first pixel gap is present between two adjacent first pixel driving circuits; and
in the inclined area, for a column of the first pixel driving circuits, lengths of all first pixel gaps are the same.

4. The display panel according to claim 3, wherein for all first pixel gaps located between adjacent rows, in a direction from the inclined area to the flush area, lengths of the first pixel gaps are gradually decreased.

5. The display panel according to claim 1, wherein in the transition sub-area, the plurality of first pixel driving circuits are distributed in a plurality of columns, each column of the first pixel driving circuits are distributed along the first direction; and
in the flush area, a number of the first pixel driving circuits in each column is the same.

6. The display panel according to claim 5, wherein for the plurality of columns of the first pixel driving circuits located in the inclined area, in a direction from the inclined area to the flush area, a number of the first pixel driving circuits in a next column is greater than or equal to a number of the first pixel driving circuits in a previous column.

7. The display panel according claim 1, wherein in the transition sub-area, the plurality of first pixel driving circuits are distributed in a plurality of columns, each column of the first pixel driving circuits are distributed along the first direction;
the second display area comprises a plurality of second pixel driving circuits distributed in a plurality of columns, and each column of the second pixel driving circuits are distributed along the first direction;
in the first direction, a column of the first pixel driving circuits is arranged corresponding to a column of the second pixel driving circuits; and
a length of the first pixel driving circuit in a direction perpendicular to the first direction is n1, and a length of the second pixel driving circuit in the direction perpendicular to the first direction is n2, wherein n1<n2.

8. The display panel according to claim 1, wherein the included angle between the inclined portion and the flush portion in an i-th row of the first pixel driving circuits is greater than or equal to the included angle between the inclined portion and the flush portion in the first row of the first pixel driving circuits, I being an integer greater than 1 and less than or equal to N.

9. The display panel according to claim 1, wherein the included angle between the included portion and the flush portion in the first row of the first pixel driving circuits ranges from 144 degrees to 152 degrees, inclusive.

10. The display panel according to claim 1, wherein in a direction from the first row of the first pixel driving circuits to the N-th row of the first pixel driving circuits, the included angle between the inclined portion and the flush portion is gradually increased.

11. The display panel according to claim 1, wherein the transition sub-area comprises two inclined areas and one flush area, the flush area is located between the two inclined areas, a row of the first pixel driving circuits extends from one of the two inclined areas to the other through the flush area.

12. The display panel according to claim 1, wherein in the first direction, a first pixel gap is present between two adjacent first pixel driving circuits;
the display panel further includes a first signal line; and
in the display transition area, the first signal line passes through the first pixel gap, and the first signal line is located between two adjacent rows of the first pixel driving circuits.

13. The display panel according to claim 12, wherein in the inclined area, the first signal line comprises a straight line segment and an inclined line segment connected to each other;
in the first direction, the straight line segment overlaps with the first pixel driving circuit;
the inclined line segment connects two adjacent straight line segments; and
an included angle between the inclined line segment and the straight line segment is in a range of [150°, 180°).

14. The display panel according to claim 13, wherein in the inclined area, in a direction from the display light transmissive area to the inclined area, the included angle between the inclined line segment and the straight line segment is gradually increased.

15. The display panel according to claim 1, wherein in a second direction and in any row of the first pixel driving circuits, a second pixel gap is present between two adjacent first pixel driving circuits;
the display transition area comprises a plurality of third signal lines extending in the first direction and electrically connected to the first pixel driving circuit, and each third signal line is located in the second pixel gap; and
the second direction is perpendicular to the first direction.

16. The display panel according to claim 15, wherein in the transition sub-area, for a row of the first pixel driving circuits, lengths of all second pixel gaps in the second direction are the same.

17. A display panel, comprising:
a first display area and the second display area, wherein the first display area comprises a display light transmissive area and a display transition area located between the display light transmissive area and the second display area;
the first display area comprises a plurality of first pixel driving circuits, and the plurality of first pixel driving circuits are located in the display transition area;
the display transition area comprises a transition sub-area located between the display light transmissive area and the second display area, wherein in the transition sub-area, the plurality of first pixel driving circuits are distributed in a plurality of rows, the plurality of rows of first pixel driving circuits are defined as a first row of the first pixel driving circuits to an N-th row of the first pixel driving circuits, and the first row of the first pixel driving circuits are located at a side of the N-th row of the first pixel driving circuits closer to the display light transmissive area, wherein N is an integer greater than or equal to 2;
the transition sub-area comprises a flush area and an inclined area that are located in one plane, a row of the first pixel driving circuits extending from the inclined area to the flush area comprises an inclined portion and a flush portion, the inclined portion is located in the inclined area, and the flush portion is located in the flush area, wherein an included angle between the inclined portion and the flush portion is an obtuse angle; and
for the first row of the first pixel driving circuits, first pixel driving circuits in the inclined portion are distributed along a first straight line, first pixel driving circuits in the flush portion are distributed along a second straight line, and the first straight line intersects with the second straight line.

18. A display device comprising a display panel,
wherein the display panel comprises:
a first display area and a second display area, wherein the first display area comprises a display light transmissive area and a display transition area located between the display light transmissive area and the second display area;
the first display area comprises a plurality of first pixel driving circuits, and the plurality of first pixel driving circuits are located in the display transition area;
the display transition area comprises a transition sub-area located between the display light transmissive area and the second display area, wherein in the transition sub-area, the plurality of first pixel driving circuits are distributed in a plurality of rows, the plurality of rows of the first pixel driving circuits are defined as a first row of the first pixel driving circuits to an N-th row of the first pixel driving circuits, and the first row of the first pixel driving circuits are located at a side of the N-th row of the first pixel driving circuits closer to the display light transmissive area, wherein N is an integer greater than or equal to 2;

the transition sub-area comprises a flush area and an inclined area that are located in one plane, a row of the first pixel driving circuits extending from the inclined area to the flush area comprises an inclined portion and a flush portion, the inclined portion is located in the inclined area, and the flush portion is located in the flush area, wherein an included angle between the inclined portion and the flush portion is an obtuse angle; and for at least three adjacent first pixel driving circuits in an inclined portion in the first row of the first pixel driving circuits, all intervals between the at least three adjacent first pixel driving circuits in the first direction are the same, wherein the first direction is perpendicular to a direction in which first pixel driving circuits in the flush area are distributed.

19. The display device according to claim 18, further comprising an optical sensor arranged corresponding to the display light transmissive area.

* * * * *